United States Patent
Inoue

(10) Patent No.: US 7,989,907 B2
(45) Date of Patent: Aug. 2, 2011

(54) BACKSIDE-ILLUMINATED SOLID-STATE IMAGE PICKUP DEVICE

(75) Inventor: Ikuko Inoue, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 12/580,456

(22) Filed: Oct. 16, 2009

(65) Prior Publication Data

US 2010/0096677 A1    Apr. 22, 2010

(30) Foreign Application Priority Data

Oct. 20, 2008    (JP) .................. 2008-269456

(51) Int. Cl.
*H01L 31/0232*    (2006.01)
*H01L 31/00*      (2006.01)

(52) U.S. Cl. ........ 257/432; 257/447; 257/448; 257/459; 257/460; 257/E31.113; 257/E31.127

(58) Field of Classification Search .......... 257/432, 257/447, 448, 459, 460, E31.113, E31.127
See application file for complete search history.

(56) References Cited

U.S. PATENT DOCUMENTS

| | | | | |
|---|---|---|---|---|
| 2009/0197365 A1* | 8/2009 | Kim et al. | ........ | 438/70 |
| 2009/0200585 A1* | 8/2009 | Nozaki et al. | ........ | 257/292 |
| 2010/0109113 A1* | 5/2010 | Jang | ........ | 257/432 |
| 2010/0116971 A1* | 5/2010 | McCarten et al. | ........ | 250/214.1 |
| 2010/0133635 A1* | 6/2010 | Lee et al. | ........ | 257/433 |
| 2010/0193845 A1* | 8/2010 | Roy et al. | ........ | 257/228 |
| 2010/0238331 A1* | 9/2010 | Umebayashi et al. | ........ | 348/294 |
| 2010/0291730 A1* | 11/2010 | Uya et al. | ........ | 438/73 |
| 2010/0327391 A1* | 12/2010 | McCarten et al. | ........ | 257/447 |
| 2010/0330728 A1* | 12/2010 | McCarten et al. | ........ | 438/70 |

FOREIGN PATENT DOCUMENTS

JP    2006-32497    2/2006

\* cited by examiner

*Primary Examiner* — Ngan Ngo
(74) *Attorney, Agent, or Firm* — Oblon, Spivak, McClelland, Maier & Neustadt, L.L.P.

(57) ABSTRACT

Provided is a backside-illuminated solid-state image pickup device capable of allowing peripheral circuits to produce stable waveforms and thereby achieving image characteristics with less noise, the device including: a first-conductivity-type semiconductor layer having a first principal surface and a second principal surface opposed to the first principal surface and also having a pixel area and an analog circuit area; a first P type area formed to lie between the second principal surface and the first principal surface in the analog circuit area; a metal layer formed at least partially on the second principal surface of the first P type area; a VSS electrode electrically connected to the metal layer; a photo-conversion area formed in the pixel area and used to accumulate electric charges generated by photoelectric conversion; and a microlens provided on the second principal surface in the pixel area so as to correspond to the photo-conversion area.

17 Claims, 16 Drawing Sheets

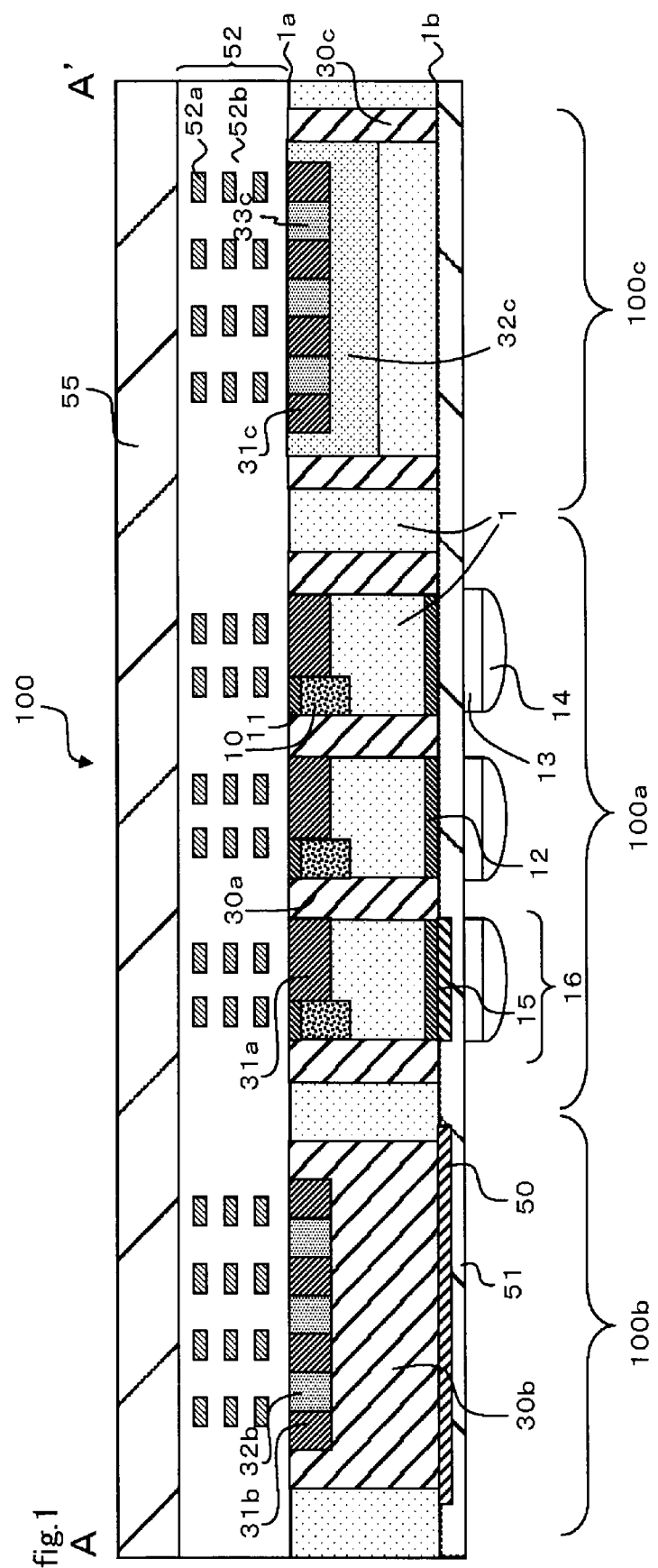

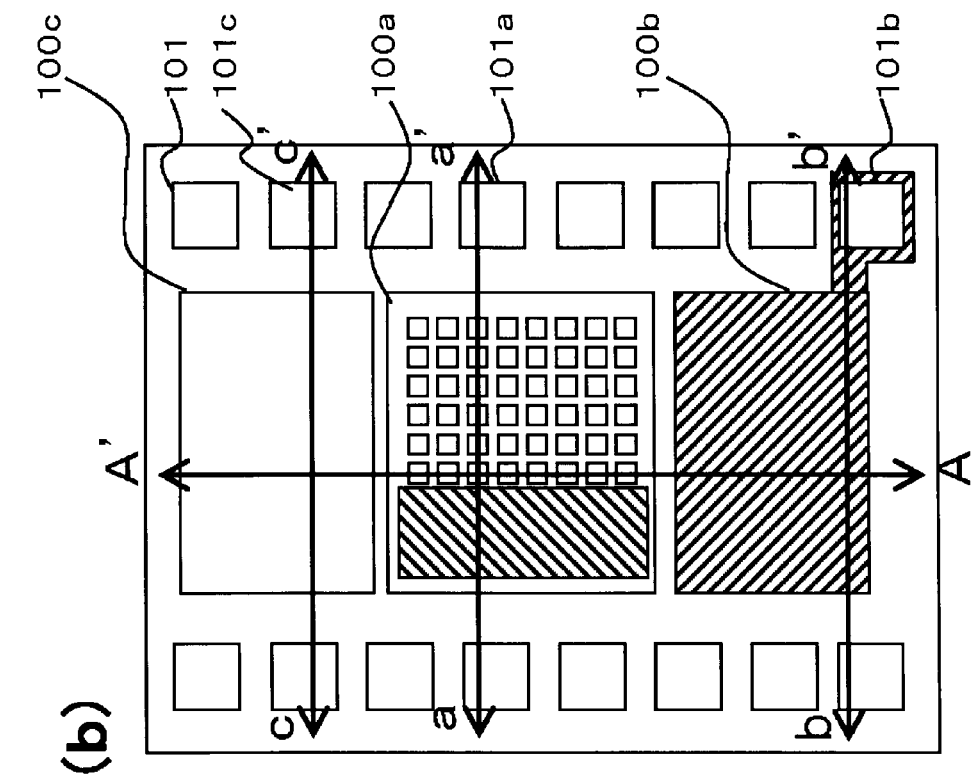
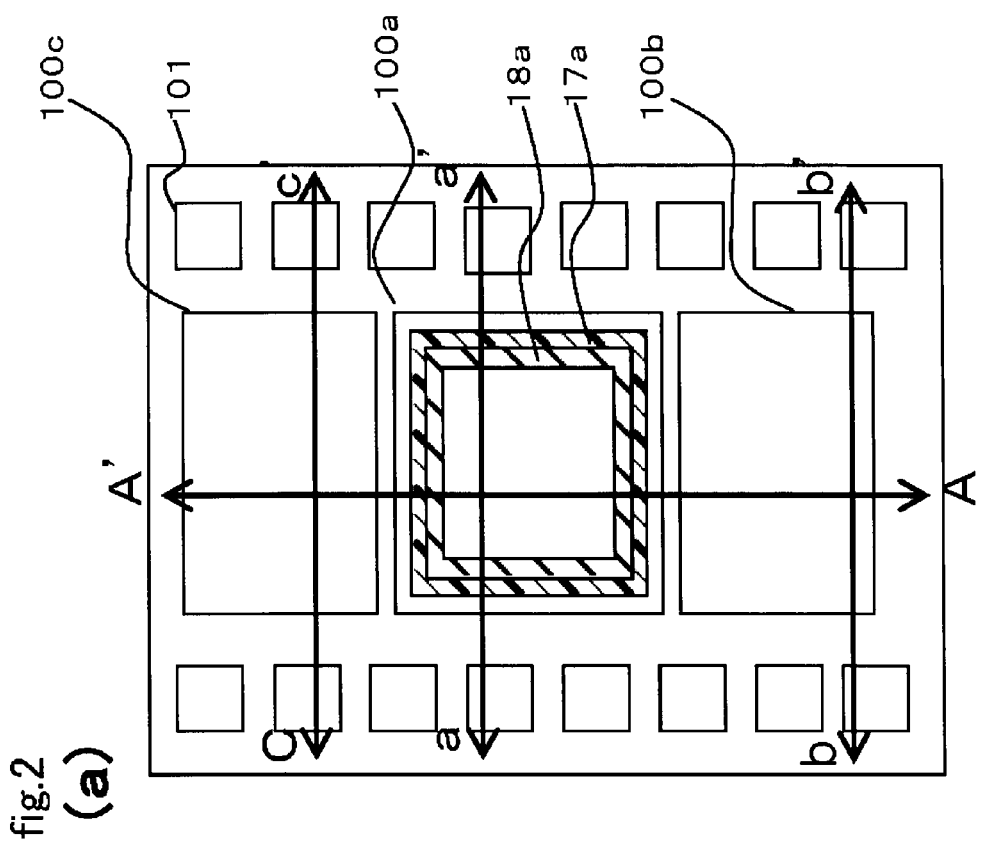

fig.6
(a)
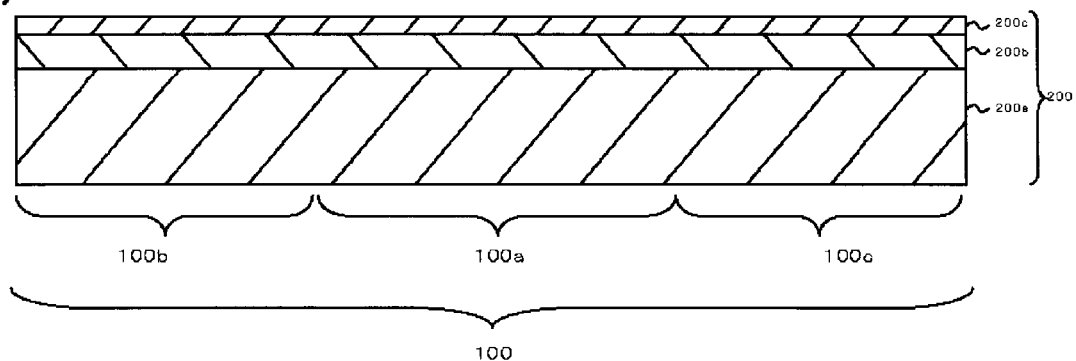
(b)
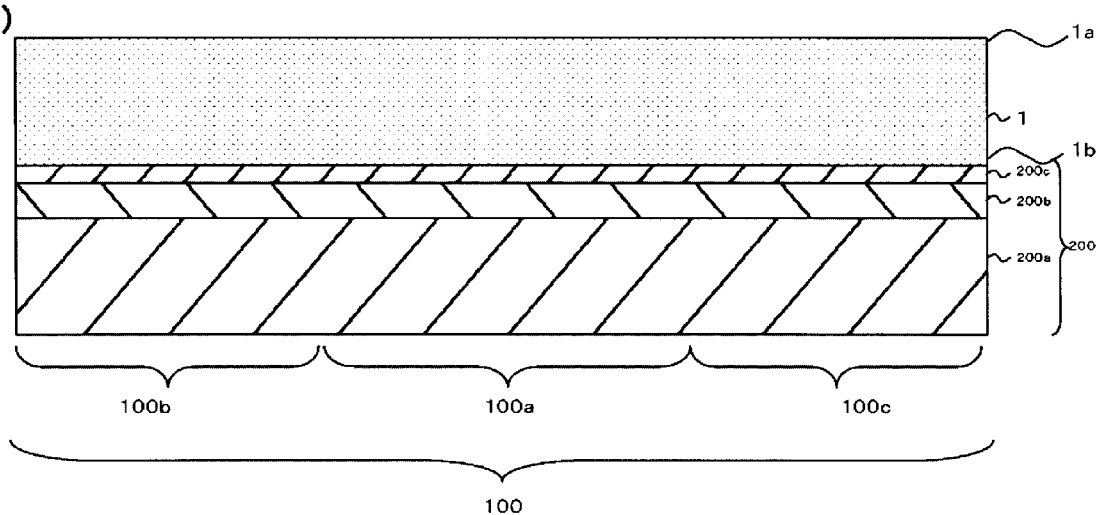
(c)
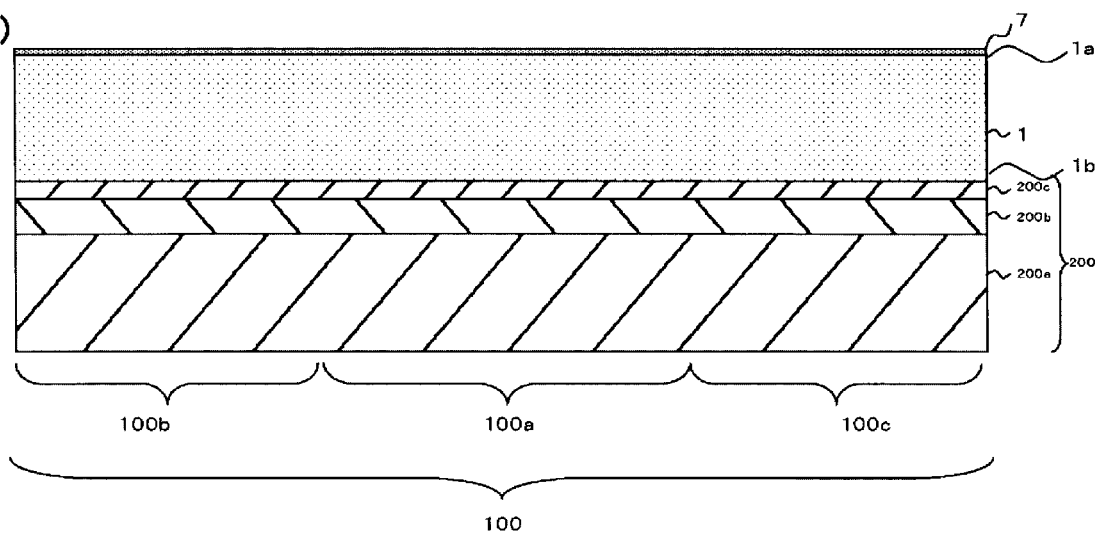

fig.7 (a)
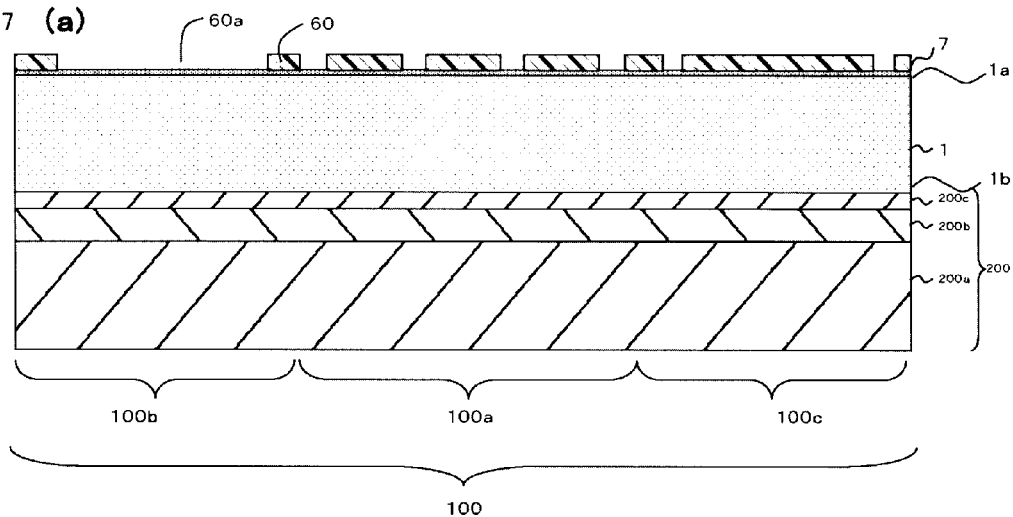
(b)
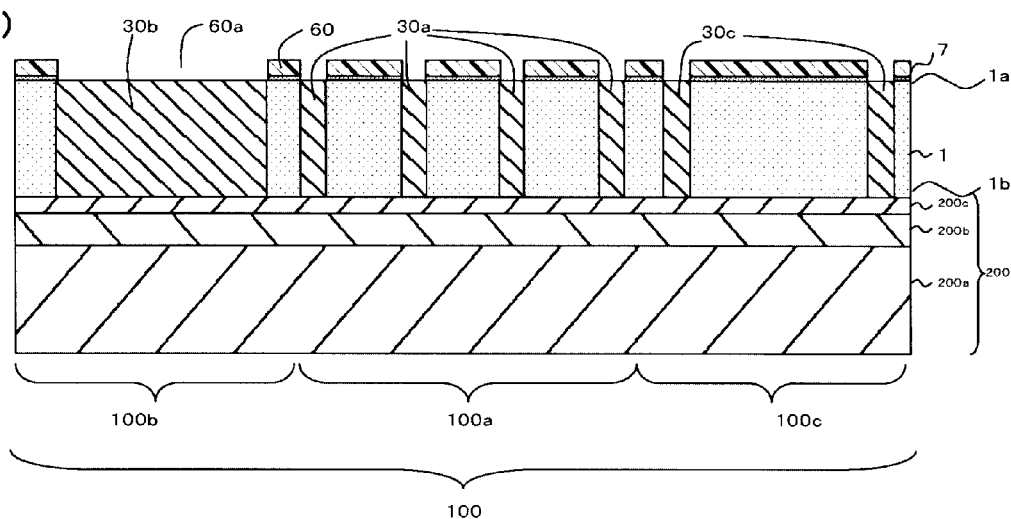
(c)
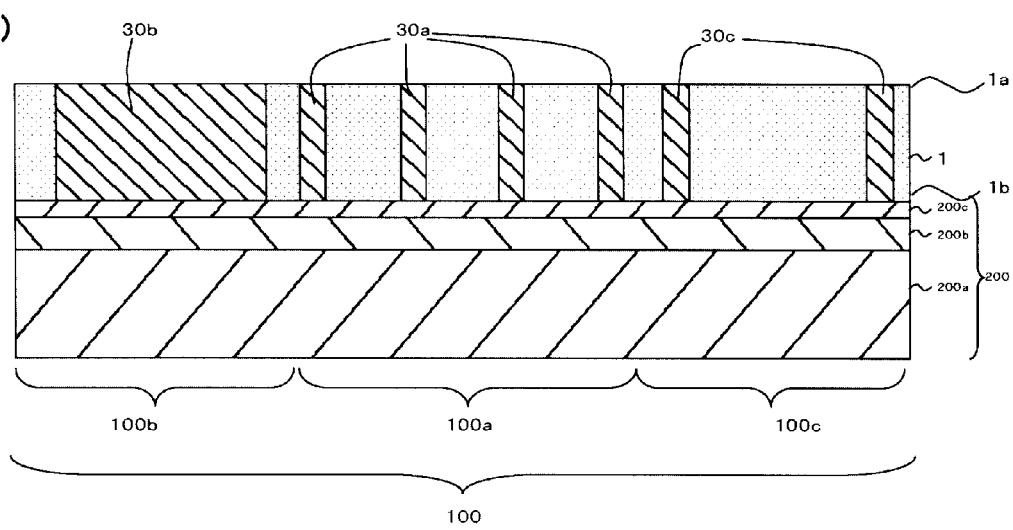

fig.8
(a)
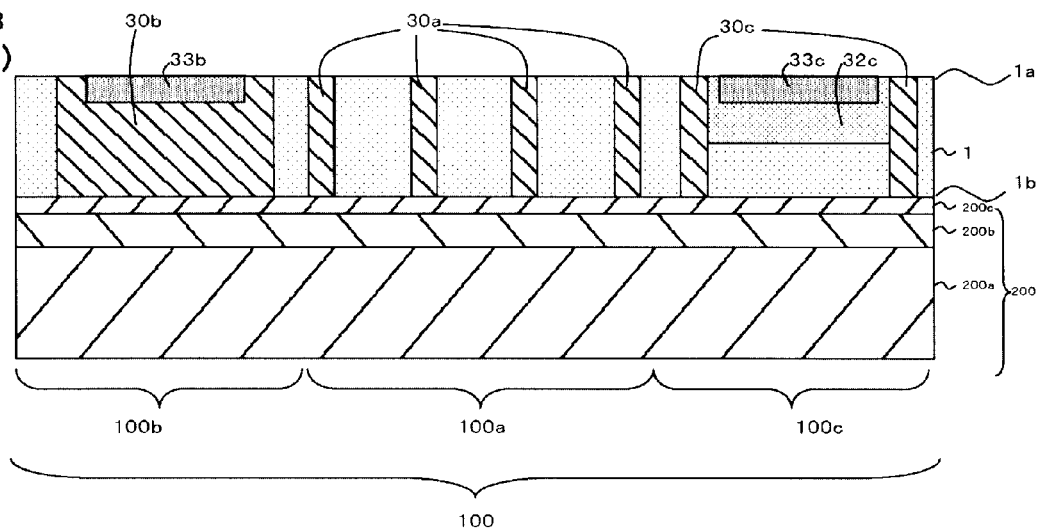
(b)
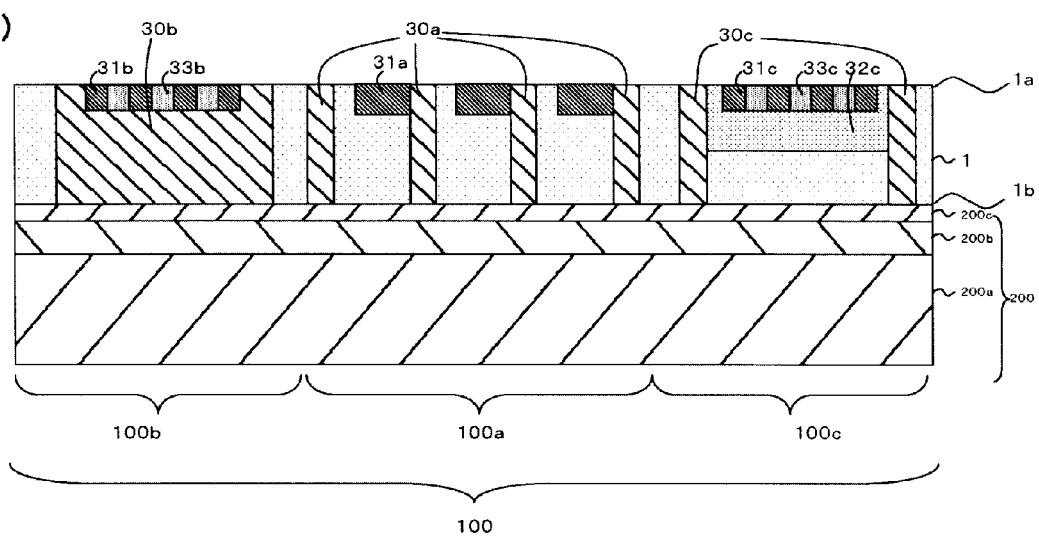
(c)
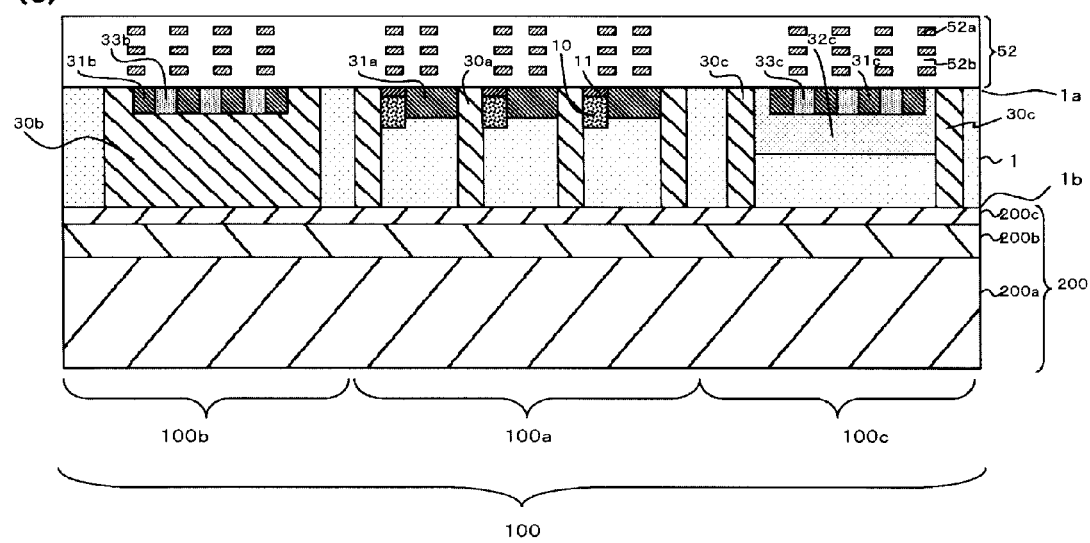

fig.9 (a)
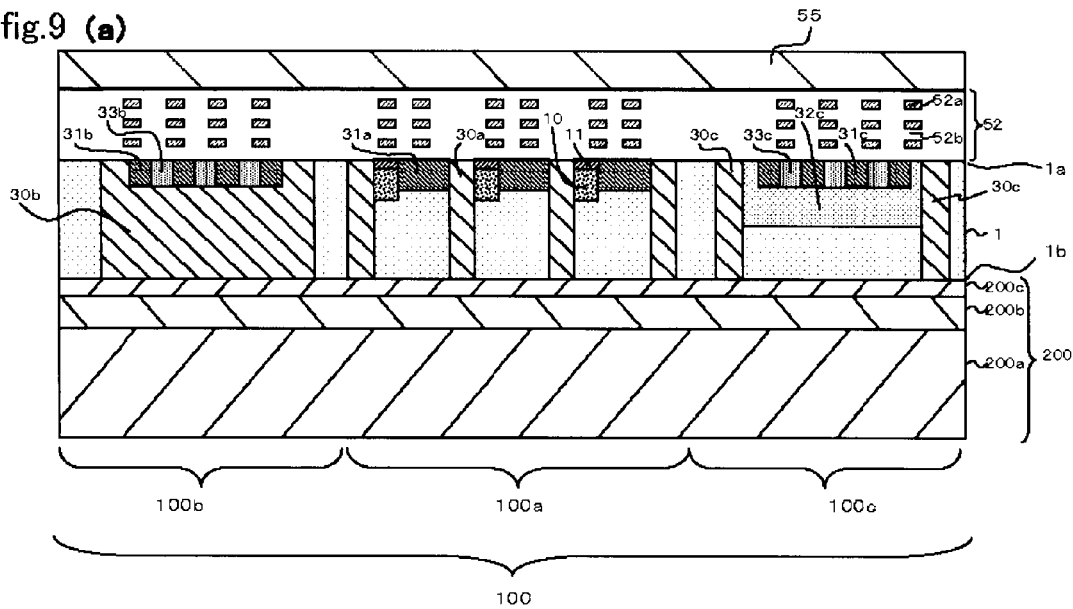
(b)
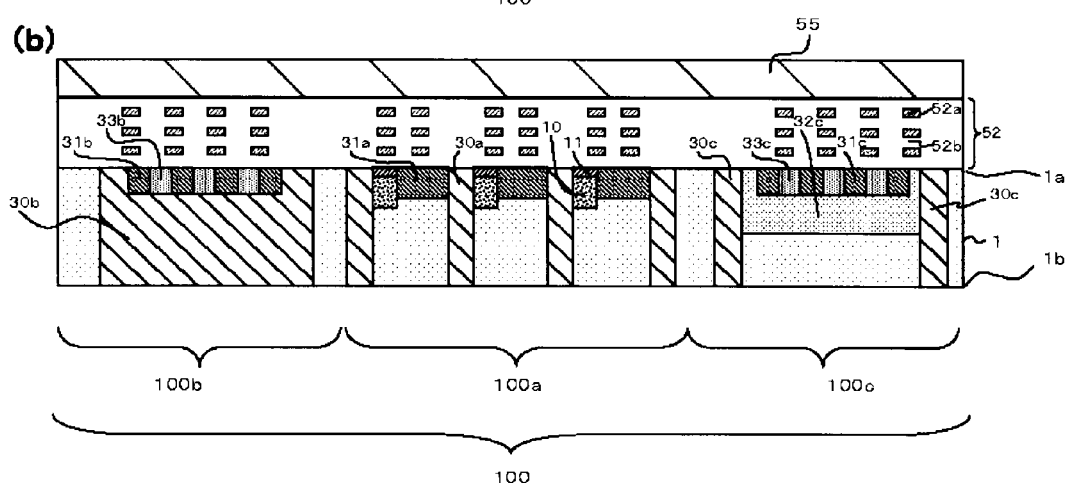
(c)
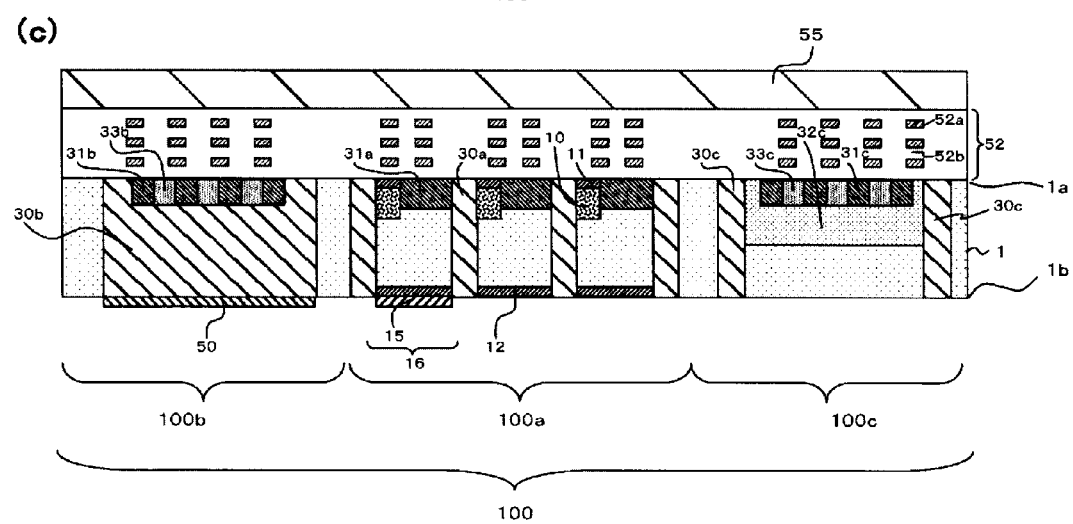

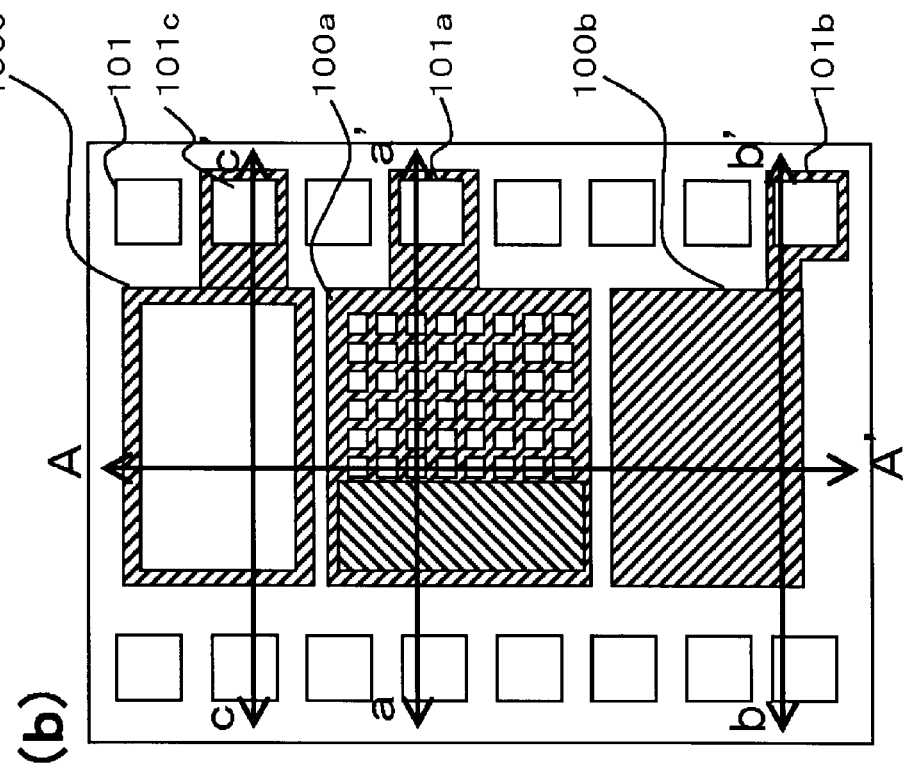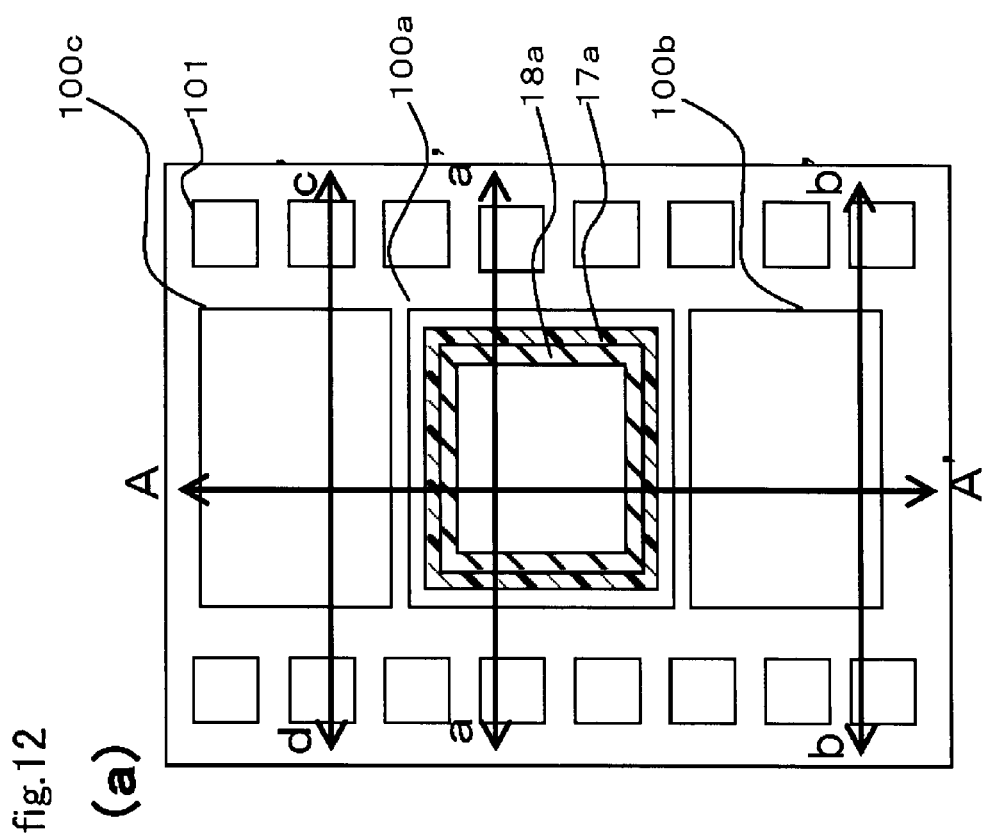
fig.12 fig.13
(a)
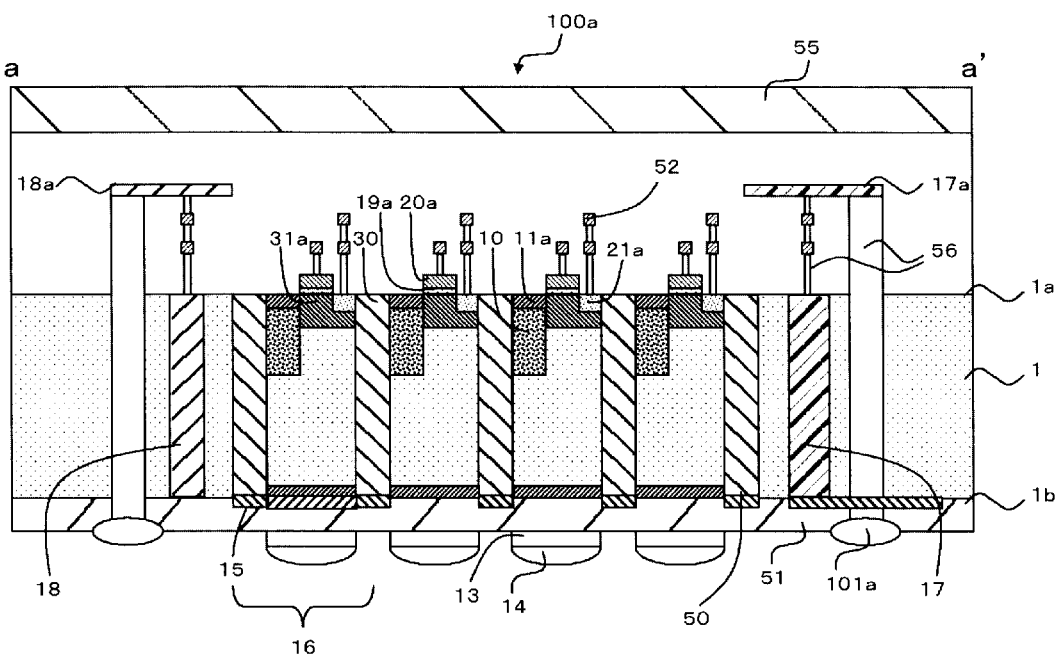
(b)
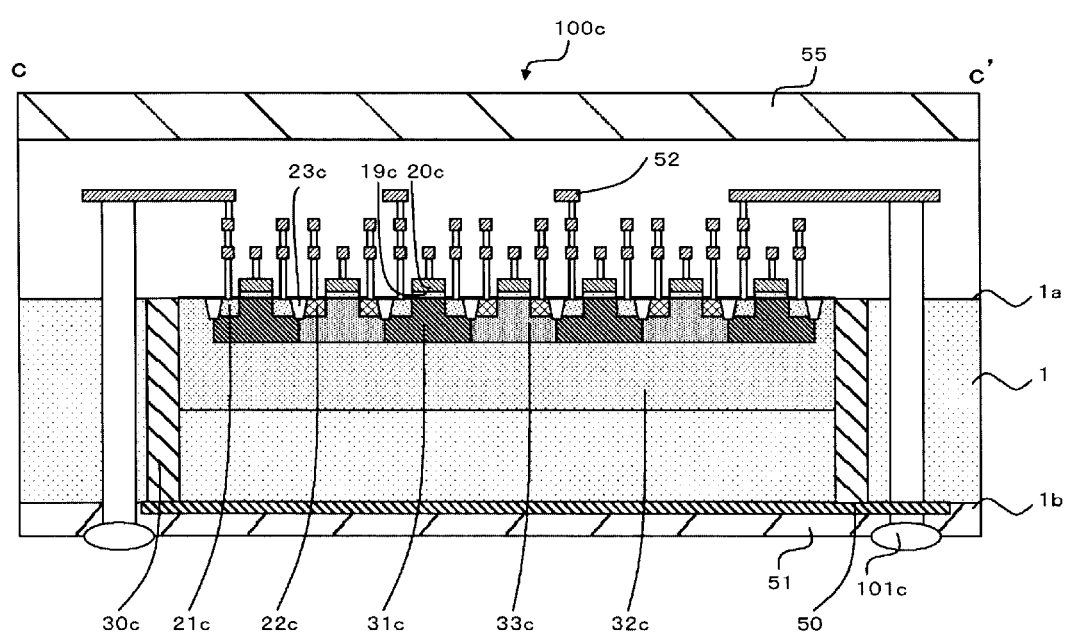

BACKSIDE-ILLUMINATED SOLID-STATE IMAGE PICKUP DEVICE

CROSS-REFERENCE TO RELATED APPLICATIONS

This application is based upon and claims the benefit of priority from prior Japanese Patent Application No. P2008-269456, filed on Oct. 20, 2008; the entire contents of which are incorporated herein by reference.

BACKGROUND OF THE INVENTION

1. Field of the Invention

The present invention relates to a backside-illuminated solid-state image pickup device and a manufacturing method thereof.

2. Description of the Related Art

The market for small-sized camera modules has been drawing attention in recent years with application of these modules to digital still cameras or camera-equipped mobile telephones. With a size reduction of pixels, an image device such as a CCD or a CMOS image sensor used for such a camera module may have lower sensitivity reduced due to a reduction in a photoelectric conversion area. The factors of the sensitivity reduction include the reduction in the photoelectric conversion area due to smaller pixels, and a reduction in the amount of incident light attributable to shielding of light by wiring.

To cope with this, a backside-illuminated image pickup device has been reported as a technique for improving sensitivity and avoiding reduction in the amount of incident light. Here, a conventional image-pickup device will be referred to as a front side-illuminated image pickup device in contrast to this backside-illuminated image pickup device.

The backside-illuminated image pickup device has peripheral circuits such as a logic circuit and an analog circuit which are formed on a front side of a silicon substrate, and a photoelectric conversion area, color filters, microlenses, and the like which are formed on a backside of the silicon substrate. The light incident on the backside of the silicon substrate is subjected to photoelectric conversion inside the silicon substrate. The electric signal thus obtained is subjected to signal processing on the front side of the silicon substrate, and then is outputted from the image pickup device.

This device achieves high sensitivity and low optical shading since no optical obstacle such as wiring exists between the microlenses and photoelectric conversion area on the backside of the silicon substrate which receives incident light. Moreover, the device also achieves high light focusing performance and low crosstalk because the color filters and the microlenses can be formed with low profiles.

However, the backside-illuminated image pickup device has the following problem related to grounding. Specifically, the conventional front side-illuminated image pickup device can be grounded with the back surface of the silicon substrate bonded to a package, and thereby the analog circuit and the like can produce stable waveforms. In contrast, having the microlenses and the like on the backside of the silicon substrate, the backside-illuminated image pickup device cannot be grounded with the back surface of the silicon substrate bonded to a package.

As a countermeasure against the problem, there is disclosed a backside-illuminated image pickup device which draws out minority carriers generated in photoelectric conversion elements in a pixel area and thereby suppresses reduction in sensitivity by grounding a photo-shielding layer that is formed around the pixel area (Japanese Patent Application Publication No. 2006-32497 (Paragraph [0020], FIG. 2), for example).

However, this image pickup device is configured without consideration of peripheral circuits including a logic circuit and an analog circuit. Accordingly, in this device, the analog circuit may fail to produce stable waveforms due to a delay or unsharp edges of a reference waveform, or pulse noises may be likely to leak in the logic circuit. This causes a problem of defects on a reproduced image that appear as vertical lines or horizontal lines, for example.

SUMMARY OF THE INVENTION

An object of the present invention is to provide a backside-illuminated solid-state image pickup device which is capable of allowing peripheral circuits to produce stable waveforms and thereby achieving image characteristics with less noise.

To attain the object, a backside-illuminated solid-state image pickup device according to an aspect of the present invention includes: a first-conductivity-type semiconductor layer having a first principal surface and a second principal surface opposed to the first principal surface and also having a pixel area and a peripheral circuits area; a second-conductivity-type first impurity layer formed to reach the second principal surface from the first principal surface in the peripheral circuits area; a first metal layer formed at least partially on the second principal surface of the second-conductivity-type first impurity layer; a first ground electrode electrically connected to the first metal layer; a photo-conversion area formed in the pixel area; and a microlens provided on the second principal surface in the pixel area so as to correspond to the photo-conversion area.

The present invention can provide a backside-illuminated solid-state image pickup device capable of allowing peripheral circuits to produce stable waveforms and thereby achieving image characteristics of less noise.

BRIEF DESCRIPTION OF THE DRAWINGS

FIG. 1 is a cross-sectional view of a backside-illuminated solid-state image pickup device according to a first embodiment of the present invention.

FIGS. 2A and 2B are plan views of the backside-illuminated solid-state image pickup device according to the first embodiment.

FIGS. 6A to 6C are views for explaining a method of manufacturing the backside-illuminated solid-state image pickup device according to the first embodiment.

FIGS. 7A to 7C are views for explaining the method of manufacturing the backside-illuminated solid-state image pickup device according to the first embodiment.

FIGS. 8A to 8C are views for explaining the method of manufacturing the backside-illuminated solid-state image pickup device according to the first embodiment.

FIGS. 9A to 9C are views for explaining the method of manufacturing the backside-illuminated solid-state image pickup device according to the first embodiment.

FIGS. 12A and 12B are plan views of the backside-illuminated solid-state image pickup device according to the second embodiment.

FIGS. 13A and 13B are cross-sectional views of the backside-illuminated solid-state image pickup device according to the second embodiment.

DETAILED DESCRIPTION OF THE PREFERRED EMBODIMENTS

First Embodiment

Figure 3:
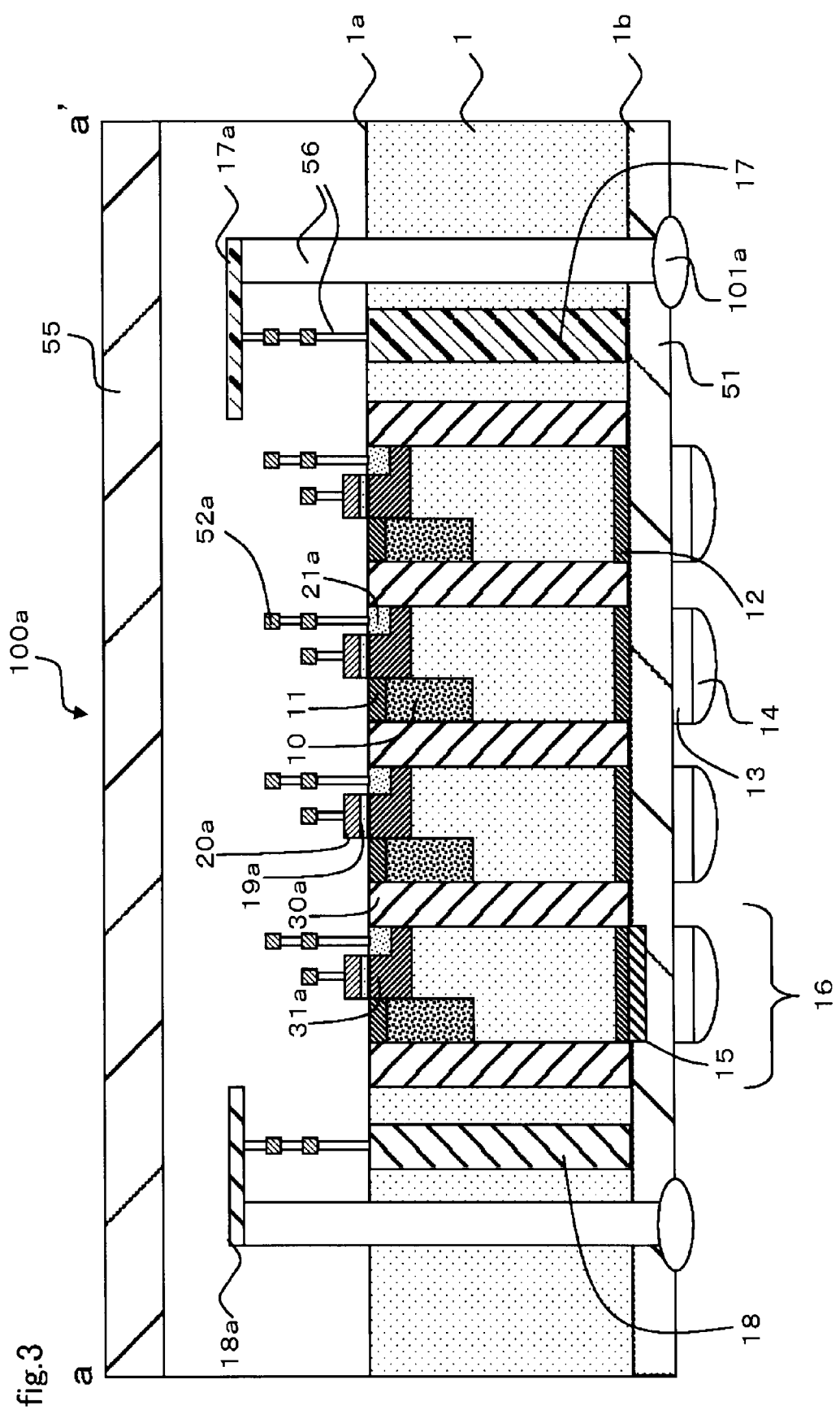
FIG. 3 is another cross-sectional view of the backside-illuminated solid-state image pickup device according to the first embodiment.

FIG. 1 is a cross-sectional view of a backside-illuminated solid-state image pickup device 100 according to a first embodiment of the present invention, and FIGS. 2A and 2B are plan views of the backside-illuminated solid-state image pickup device 100 according to the first embodiment of the present invention (in which FIG. 2A shows a front surface side and FIG. 2B shows a back surface side). Note that the cross-sectional view in FIG. 1 is one taken along an A-A' line in FIG. 2.

As shown in FIG. 1, the backside-illuminated solid-state image pickup device 100 of this embodiment includes an N type semiconductor layer 1, and this semiconductor layer 1 includes a first principal surface (a front surface) 1a and a second principal surface (a back surface) 1b opposed to this first principal surface 1a. Moreover, this semiconductor layer 1 includes a pixel area 100a, and an analog circuit area 100b as well as a logic circuit area 100c which collectively serve as a peripheral circuits area.

Photodiodes are formed on the first principal surface 1a side of the semiconductor layer 1 in the pixel area 100a of the backside-illuminated solid-state image pickup device 100. Each photodiode includes: an N type photo-conversion area 10 for capturing visible light and accumulating signal charges obtained by photoelectric conversion in the N type semiconductor layer 1; and a first P type shield layer 11 for preventing dark currents that cause noises. Moreover, a first P type area 30a is formed so as to lie between the first principal surface 1a and the second principal surface 1b, to contact part of a side face of the photo-conversion area 10 and to surround the photo-conversion area 10. A second P type area 31a is formed so as to bury the first principal surface 1a side of an area interposed between the photo-conversion area 10 and the first P type area 30a out of the area surrounded by this first P type area 30a. Furthermore, a second P type shield layer 12 is formed so as to cover the second principal surface 1b side of the area surrounded by the first P type area 30a.

In addition, a planarizing layer 51 made of a silicon nitride film, for example, is formed outside the second principal surface 1b of the semiconductor layer 1, and a color filter 13 and a microlens 14 are formed outside the planarizing layer 51 so as to correspond to the photo-conversion area 10. Moreover, an optical black portion 16 is formed by providing a photo-shielding layer 15 between the microlens 14 and the second principal surface 1b in an area which is located at the second principal surface 1b side of the semiconductor layer 1 and corresponds to at least one photo-conversion area 10. This optical black portion 16 is used for correction of a dark current. Here, the color filter 13 or the microlens 14 may be formed on the optical black portion 16 when appropriate.

In the analog circuit area 100b, a first P type area 30b is formed to lie between the first principal surface 1a and the second principal surface 1b. A metal layer 50 having a film thickness of 300 to 800 nm is formed at the second principal surface 1b side of the first P type area 30b and this metal layer 50 is grounded. Meanwhile, second P type areas 31b and second N type areas 33b are alternately formed on the first principal surface 1a side of the first P type area 30b. As will be described later, an NMOSFET is formed in each of the second P type areas 31b and a PMOSFET is formed in each of the second N type areas 33b. Moreover, the planarizing layer 51 is formed on the second principal surface 1b so as to cover the metal layer 50.

In the logic circuit area 100c, a first N type area 32c is formed on the first principal surface 1a side of the semiconductor layer 1 and a first P type area 30c is formed so as to lie between the first principal surface 1a and the second principal surface 1b and to surround this first N type area 32c. Meanwhile, second N type areas 33c and second P type areas 31c are alternately formed in the first N type area 32c. As will be described later, a PMOSFET is formed in each of the second N type areas 33c and an NMOSFET is formed in each of the second P type areas 31c. Moreover, the planarizing layer 51 is formed on the second principal surface 1b.

Further, a wiring layer 52 is formed at the first principal surface 1a side of the semiconductor layer 1 in the pixel area 100a, the analog circuit area 100b, and the logic circuit area 100c. The wiring layer 52 includes interconnections 52a formed as appropriate and an interlayer insulation film 52b formed between the interconnections 52a. A support substrate 55 is formed on the wiring layer 52 with an adhesion layer (not shown) interposed therebetween. This support substrate 55 is used to support the backside-illustrated solid-state image pickup device 100.

Next, the pixel area 100a will be described in detail with reference to FIG. 3. FIG. 3 is a cross-sectional view taken along an a-a' line in FIG. 2A.

In the pixel area 100a, as described previously, the photodiodes are formed on the first principal surface 1a side of the semiconductor layer 1. Each photodiode includes the N type photo-conversion area 10 for capturing visible light and accumulating signal charges obtained by photoelectric conversion in the N type semiconductor layer 1, and the first P type shield layer 11. Moreover, the first P type area 30a is formed so as to surround the photo-conversion area 10 and to lie between the first principal surface 1a and the second principal surface 1b, and the second P type shield layer 12 is formed on the second principal surface 1b side of the semiconductor layer 1.

The second P type shield layer 12 has the same usage as that of the first shield layer 11. If the second P type shield layer 12 is not formed, a depletion layer of the photo-conversion area 10 spreading on the second principal surface 1b may capture leak currents attributable to damages or defects on the second principal surface 1b, thereby causing noises. However, by forming the second P type shield layer 12, the depletion layer will not spread to an interface of the second principal surface 1b. Therefore, it is possible to reduce noises and to improve sensitivity of the image pickup device.

Then, a via 56 is connected to a VSS pad 101*a* which is formed at the second principal surface 1*b* side of the semiconductor layer 1. Note that, the first P type area 30*a* formed in this pixel area 100*a* functions as a pixel separation area.

Meanwhile, as shown in FIG. 2A, VSS wiring 17*a* which is electrically connected to a VSS electrode 17 is formed substantially along an inner periphery of the pixel area 100*a* on the upper side of the wiring layer 52. Moreover, VDD wiring 18*a* which is electrically connected to a VDD electrode 18 is formed substantially along an inner periphery of the VSS wiring 17*a*.

In this way, by being formed to surround the pixel area 100*a*, the VSS wiring 17*a* can be grounded in the entire pixel area 100*a*. This enables supplying stable pulses to pixels. Moreover, by forming the VDD wiring 18*a* so as to surround the pixel area 100*a*, it is possible to prevent noises such as electrons generated by photoelectric conversion in the peripheral circuits or leak currents generated in the peripheral circuits from leaking in the pixel area 100*a* and also to prevent electrons generated by photoelectric conversion in the pixel area 100*a* from leaking to the peripheral circuits.

Further, the second P type area 31*a* is formed so as to bury the first principal surface 1*a* side of the area interposed between the photo-conversion area 10 and the first P type area 30*a*, and an N type source/drain region 21*a* made of an N type diffusion layer is formed in the surface of the second P type area 31*a*. Moreover, in an area interposed between the photo-conversion area 10 and the N type source/drain region 21*a*, a gate electrode 20*a* is formed on the first principal surface 1*a* with a gate insulation film 19*a* interposed therebetween. In this way, a read MOSFET for reading out charges accumulated in the photo-conversion area 10 is formed.

Figure 4:
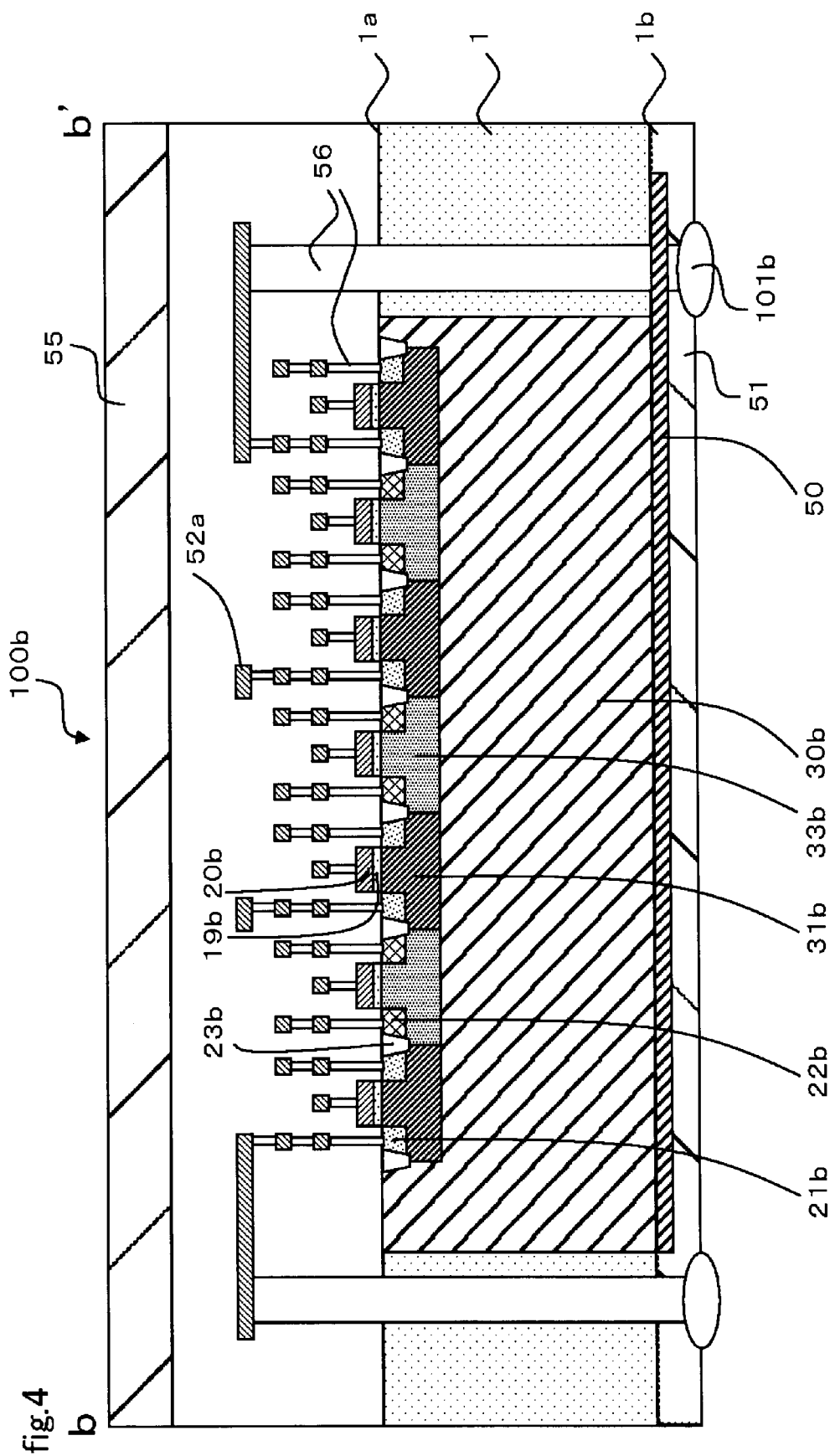
FIG. 4 is still another cross-sectional view of the backside-illuminated solid-state image pickup device according to the first embodiment.

Next, the analog circuit area 100*b* will be described in detail with reference to FIG. 4. FIG. 4 is a cross-sectional view taken along a b-b' line in FIG. 2A.

As described previously, in the analog circuit area 100*b*, the first P type area 30*b* is formed to lie between the first principal surface 1*a* and the second principal surface 1*b*, of the semiconductor layer 1. Moreover, the metal layer 50 having the film thickness of 300 to 800 nm is formed at the second principal surface 1*b* side of the first P type area 30*b*. As shown in FIG. 2B, this metal layer 50 is grounded by being formed to reach the via 56 connected to a VSS pad 101*b* serving as a ground electrode.

The second P type areas 31*b* and the second N type areas 33*b* are alternately formed on the first principal surface 1*a* side of the first P type area 30*b*. Moreover, an NMOSFET is provided by forming a pair of N type source/drain regions 21*b* at the first principal surface 1*a* side of the second P type area 31*b* and by forming a gate electrode 20*b* on the first principal surface 1*a* and between the pair of N type source/drain regions 21*b* with a gate insulation film 19*b* interposed between the gate electrode 20*b* and the first principal surface 1*a*. In the meantime, a PMOSFET is provided by forming a pair of P type source/drain regions 22*b* at the first principal surface 1*a* side of the second N type area 33*b* and by forming the gate electrode 20*b* on the first principal surface 1*a* and between the pair of P type source/drain regions 22*b* with the gate insulation film 19*b* interposed between the gate electrode 20*b* and the first principal surface 1*a*.

The interconnections 52*a* are connected to the N type source/drain regions 21*b*, the P type source/drain regions 22*b*, and the gate electrodes 20*b* through the via 56 as appropriate. Meanwhile, part of the interconnections 52*a* is further connected to the VSS pad 101*b* through the via 56.

Figure 5:
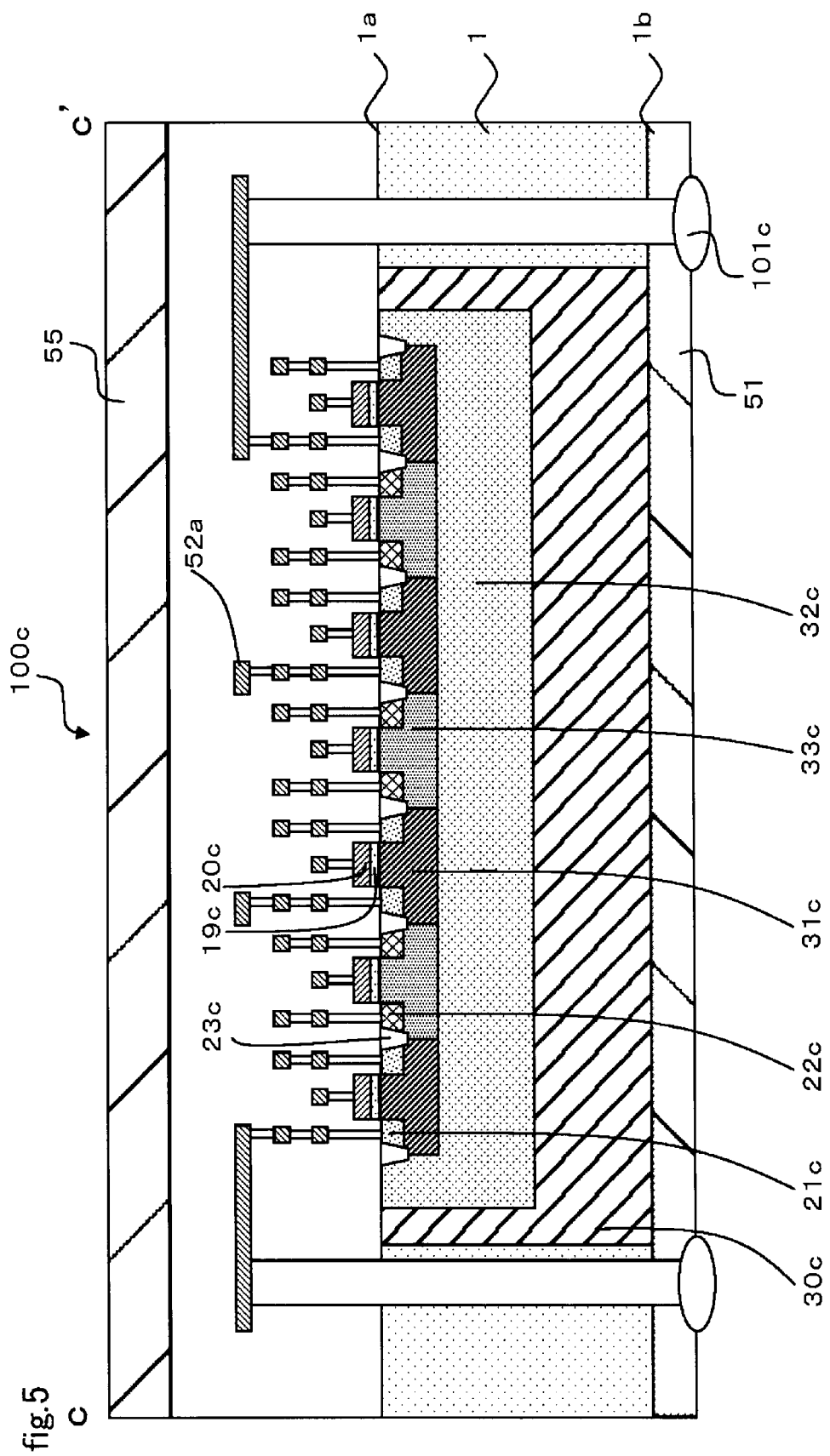
FIG. 5 is still another cross-sectional view of the backside-illuminated solid-state image pickup device according to the first embodiment.
Figure 10:
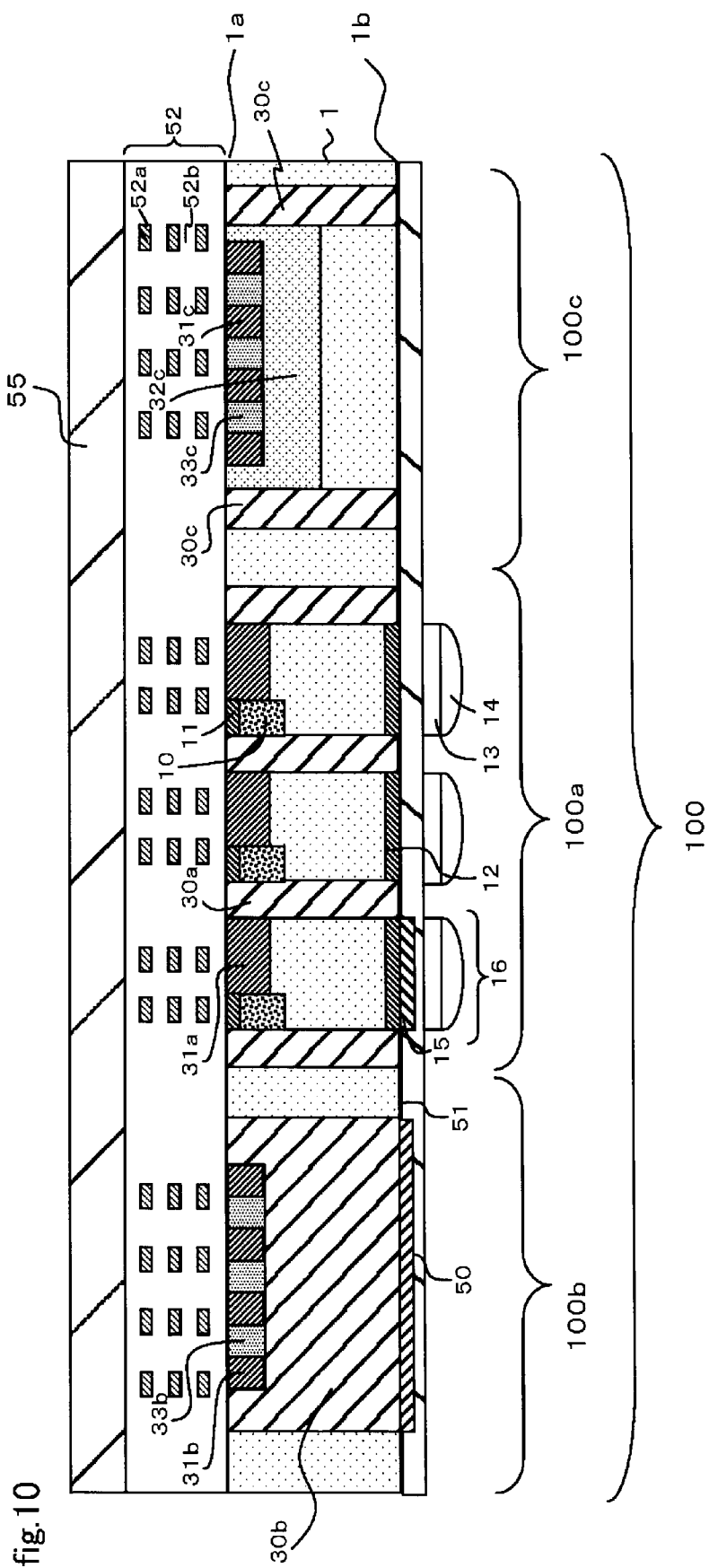
FIG. 10 is a view for explaining the method of manufacturing the backside-illuminated solid-state image pickup device according to the first embodiment.

Next, the logic circuit area 100*c* will be described in detail with reference to FIG. 5. FIG. 5 is a cross-sectional view taken along a c-c' line in FIG. 2A.

As described previously, in the logic circuit area 100*c*, the first N type area 32*c* is formed on the first principal surface 1*a* side of the semiconductor layer 1 and the first P type area 30*c* is formed so as to lie between the first principal surface 1*a* and the second principal surface 1*b* and to surround this first N type area 32*c*.

The second N type areas 33*c* and the second P type areas 31*c* are alternately formed at the first principal surface 1*a* side of the first N type area 32*c*. Moreover, a PMOSFET is provided by forming a pair of P type source/drain regions 22*c* at the first principal surface 1*a* side of the second N type area 33*c* and by forming a gate electrode 20*c* on the first principal surface 1*a* and between the pair of P type source/drain regions 22*c* with a gate insulation film 19*c* interposed between the gate electrode 20*c* and the first principal surface 1*a*. In the meantime, an NMOSFET is provided by forming a pair of N type source/drain regions 21*c* at the first principal surface 1*a* side of the second P type area 31*c* and by forming the gate electrode 20*c* on the first principal surface 1*a* and between the pair of N type source/drain regions 21*c* with the gate insulation film 19*c* interposed between the gate electrode 20*c* and the first principal surface 1*a*.

The P type source/drain regions 22*c*, the N type source/drain regions 21*c*, and the gate electrodes 20*c* are connected to the interconnections 52*a* through the via 56 as appropriate.

By applying the above-described configuration, in the backside-illuminated solid-state image pickup device 100 provided with the microlenses 14 and the like on its backside, it is possible to ground the backside of the analog circuit area 100*b* which is one of the peripheral circuits of the pixel area 100*a*. This reduces delay of reference waveforms in the analog circuit area 100*b*, thereby producing stable waveforms. In this way, it is possible to reduce vertical lines or horizontal lines on a reproduced image, and consequently to improve image quality.

Next, a manufacturing process according to this embodiment will be described with reference to FIG. 6A to FIG. 10.

First, as shown in FIG. 6A, an SOI (silicon-on-insulator) substrate 200 is prepared by stacking a BOX (buried oxide) layer 200*b* and an SOI layer 200*c* on a semiconductor substrate 200*a*. Here, the SOI layer 200*c* is N type crystalline silicon having a film thickness of 50 to 100 nm and a density of $10^{15}$ to $10^{17}$ cm$^{-3}$.

Next, as shown in FIG. 6B, a semiconductor layer 1 made of an N type epitaxial layer having a film thickness of 3 to 8 μm and a density of $10^{15}$ to $10^{17}$ cm$^{-3}$ is formed on the entire surface of the SOI layer 200*c*. Subsequently, as shown in FIG. 6C, a silicon oxide film 7 is stacked on the semiconductor layer 1. Then, a resist 60 is coated on the silicon oxide film 7, and openings 60*a* are formed by using a publicly-known lithography technique.

Here, the openings 60*a* are provided so as to respectively correspond to positions where the first P type area 30*a* used for separating pixels to be formed in the pixel area 100*a*, the first P type area 30*b* to be formed in the analog circuit area 100*b*, and the first P type area 30C to be formed in the logic circuit area 100*c*, are to be formed.

Subsequently, the silicon oxide film 7 is etched and removed by using the resist 60 as a mask to thereby expose the first principal surface 1*a* of the semiconductor layer 1. First P type areas 30*a*, 30*b*, and 30*c* are formed by high acceleration ion implantation in the areas where the semiconductor layer 1 is exposed. These first P type areas 30*a*, 30*b*, and 30*c* are formed by, for example, sequentially implanting boron having a density of around $10^{11}$ to $10^{13}$ cm$^{-2}$ at acceleration energy of around 100 kev to 3 Mev so that a P type dopant may be uniformly dispersed in these areas. At this time, an upper limit of the acceleration energy to be applied to the implanted ions is determined by the performance of an ion implanting apparatus, productivity, a mask process, and so forth, and it is appropriate to set the upper limit to 3 Mev or less.

Next, as shown in FIG. 7C, the resist 60 and the silicon oxide film 7 are sequentially removed. Thereafter, as shown in FIG. 8A, by using a publicly-known lithography technique, a first N type area 32c is formed in the logic circuit area 100c, and then a second N type area 33c in which a transistor is created is formed in the first N type area 32c. Moreover, a second N type area 33b in which a transistor is created is subsequently formed in the first P type area 30b that is formed in the analog circuit area 100b.

Next, as shown in FIG. 8B, second P type areas 31b are selectively formed in the second N type area 33b, and second P type areas 31c are selectively formed in the second N type area 33c, on the first principal surface 1a side of the area, which is surrounded by the first P type area 30a, of the pixel area 100a.

Thereafter, as shown in FIG. 4 and FIG. 5, an isolation insulation film 23b is formed in a boundary portion between the second P type area 31b and the second N type area 33b in the analog circuit area 100b, and an isolation insulation film 23c is formed in a boundary portion between the second P type area 31c and the second N type area 33c in the logic circuit area 100c. The isolation insulation films 23b and 23c are formed by creating trenches respectively on the boundary portion between the second P type area 31b and the second N type area 33b and on the boundary portion between the second P type area 31c and the second N type area and 33c, and then burying insulation films such as silicon oxide films into the trenches.

Next, as shown in FIGS. 3 to 5, gate electrodes 20a, 20b, and 20c are formed on the first principal surface 1a in the pixel area 100a, the analog area 100b, and the logic area 100c with the gate insulation films 19a, 19b, and 19c in between, respectively. Here, the gate electrodes 20a, 20b, and 20c are formed by subjecting polycrystalline silicon to patterning by use of the publicly-known lithography and dry etching techniques.

Next, as shown in FIG. 3, an N type photo-conversion area 10 is formed in the first principal surface 1a side of the semiconductor layer 1 surrounded by the first P type area 30a with the gate electrode 20a in the pixel area 100a used as a mask. Then, a first P type shield layer 11 for preventing dark currents is formed so as to cover the first principal surface 1a side of the photo-conversion area 10 and then an N type source/drain region 21a is subsequently formed. The N type source/drain region 21a is formed in a surface portion of the first P type area 31a with the gate electrode 20a used as a mask.

Meanwhile, as shown in FIG. 4, N type source/drain regions 21b are formed on a surface portion of the P type well 31b in the analog circuit area 100b, and subsequently P type source/drain regions 22b are formed on a surface portion of the N type well 33b in the analog circuit area 100b.

Similarly, as shown in FIG. 5, N type source/drain regions 21c are formed on a surface portion of the P type well 31c in the logic circuit area 100c, and subsequently P type source/drain regions 22c are formed on a surface portion of the N type well 33c in the logic circuit area 100c.

The N type and P type source/drain regions 21b and 22b are formed by using the gate electrode 20b as a mask, whereas the N type and P type source/drain regions 21c and 22c are formed by using the gate electrode 20c as a mask.

Next, as shown in FIG. 8C, a wiring layer 52 is formed on the first principal surface 1a of the semiconductor layer 1. The wiring layer 52 includes interconnections 52a that are formed with a publicly-known multilayer wiring process, an interlayer insulation film 52b that is made of a silicon oxide film, a silicon nitride film or the like, and so forth. Here, the interconnections 52a are electrically connected to the P type source/drain regions 22a, 22b, and 22c, the N type source/drain regions 21a, 21b, and 21c, and the like through the vias 56 as appropriate.

As shown in FIG. 9A, an adhesion layer (not shown) made of a silicon oxide film is formed on the wiring layer 52 and a surface of the adhesion layer is polished to be planarized. Moreover, a support substrate 55 similarly provided with an adhesion layer (not shown) made of a silicon oxide on its surface is prepared. Then, the wiring layer 52 and the support substrate 55 are bonded together by causing the respective adhesion layers to face each other.

Next, as shown in FIG. 9B, the SOI substrate 200 made of the semiconductor substrate 200a, the BOX layer 200b, and the SOI layer 200c is removed with a CMP method, a wet etching method using an HF solution or the like, thereby exposing the first P type areas 30a, 30b, and 30c on the second principal surface 1b. Then, a metal layer 50 being made of Al or the like and having a thickness of 300 to 800 nm is made by sputtering so that the exposed surface of the first P type area 30b in the analog circuit area 100b, which is exposed on the second principal surface 1b, can be connected to the VSS pad 101b serving as the ground electrode in the analog circuit area as shown in FIG. 4 through the via 56.

This metal layer 50 is formed so that the metal layer 50 can substantially cover the second principal surface 1b side of the analog circuit area and that one end of the metal layer 50 can be connected to the VSS pad 101b. In this way, by drawing out the metal layer 50 by sputtering, the metal layer 50 to be grounded may be electrically connected to the VSS pad 101b. As a result, the second principal surface 1b side of the analog circuit area 100b has low resistance of about 3 to 10 O. Hence it is possible to establish ground contact stably and consequently to supply stable pulses to the analog circuit area.

Thereafter, second P type shield layers 12 are formed on the second principal surface 1b side of the area surrounded by the first P type area 30a of the pixel area 100a. Moreover, a photo-shielding layer 15 is formed outside at least one of the second P type shield layers 12. The photodiode including this photo-shielding layer 15 constitutes the optical black portion 16.

Then, a planarizing layer 51 is formed at the second principal surface 1b side of the semiconductor layer 1 by use of acrylic resin, a silicon oxide film or the like. A color filter 13 is formed outside the planarizing layer 51 in an area at least corresponding to each photo-conversion area 10 in the pixel area 100a, and then a microlense 14 is formed outside the color filter 13.

According to this embodiment, it is possible to ground the back surface of the analog circuit area being one of the peripheral circuits of the pixel area. Therefore, in the backside-illuminated solid-state image pickup device that can realize higher sensitivity and less optical shading even when pixels are downsized, delay of reference waveforms in an analog circuit is reduced and thereby stable waveforms can be produced. In this way, it is possible to reduce vertical lines or horizontal lines on a reproduced image, and thereby to improve image quality.

Second Embodiment

Figure 11:
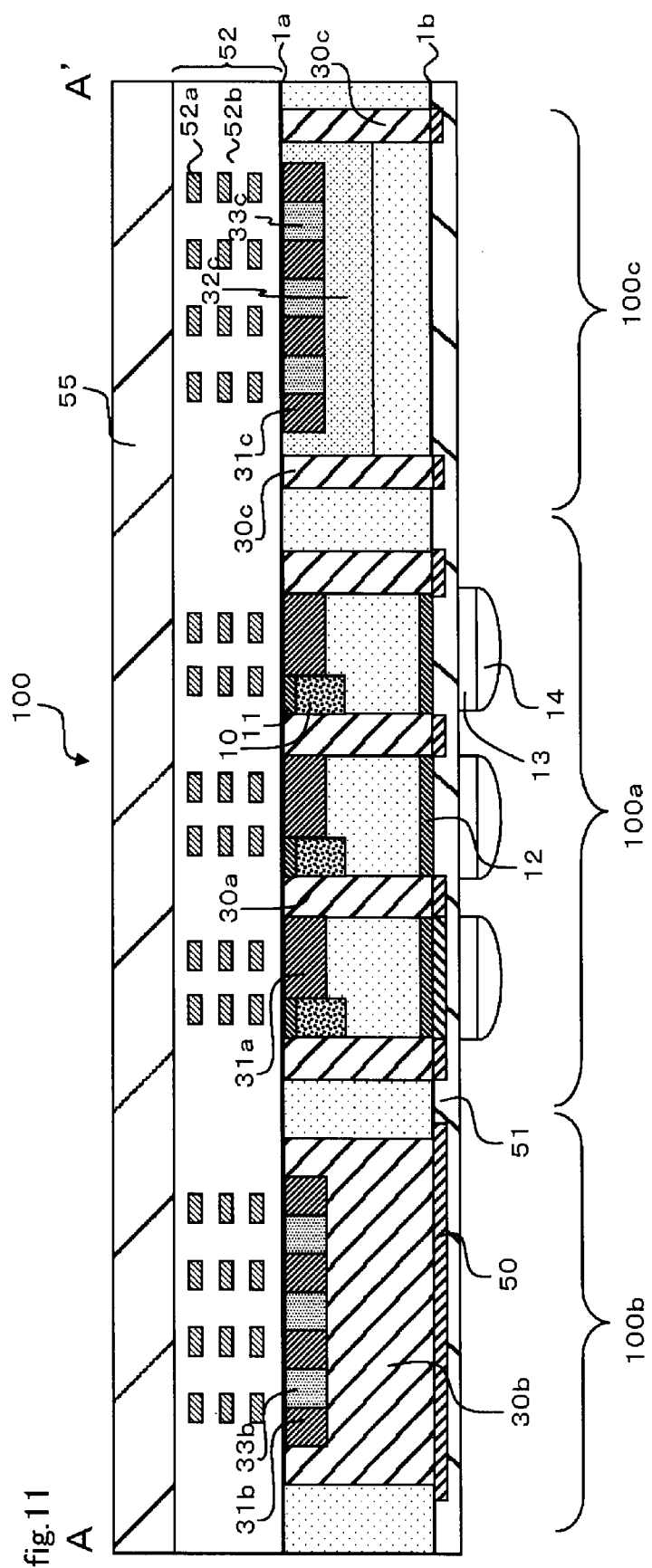
FIG. 11 is a cross-sectional view of the backside-illuminated solid-state image pickup device according to a second embodiment.

FIG. 11 is a cross-sectional view of a backside-illuminated solid-state image pickup device 100 according to a second embodiment of the present invention, and FIGS. 12A and 12B are plan views of the backside-illuminated solid-state image pickup device 100 according to the second embodiment of the present invention (in which FIG. 2A shows a front surface side and FIG. 2B shows a back surface side). Note that the cross-sectional view in FIG. 11 is one taken along an A-A' line in FIG. 12.

This embodiment is different from the first embodiment in that the metal layer which is grounded is provided only on the back surface side of the analog circuit area in the first embodiment, whereas metal layers which are grounded are also provided on the back surface side of the pixel area and the logic circuit area in this embodiment.

To be more precise, as shown in FIG. 11, the backside-illuminated solid-state image pickup device 100 of this embodiment also includes the metal layers 50 having a film thickness of 300 to 800 nm on the second principal surface 1b of the pixel area 100a and the logic circuit area 100c, and these metal layers 50 are grounded.

The pixel area 100a will be described in detail with reference to FIG. 13A. FIG. 13A is a cross-sectional view taken along an a-a' line in FIG. 12A.

As described previously, unlike the first embodiment, the metal layer 50 having a film thickness of 300 to 800 nm is formed at the second principal surface 1b side of the first P type area 30a in the pixel area 100a. As shown in FIG. 12B, this metal layer 50 is grounded by being formed to reach the via 56 that is connected to the VSS pad 101a serving as the ground electrode.

Here, the metal layer 50 is formed at the second principal surface 1b side of the first P type area 30a which is formed so as to surround the photo-conversion areas 10. Accordingly, the metal layer 50 is disposed in a mesh fashion in the pixel area 100a as shown in the plan view of FIG. 12B.

The specific configuration of the analog circuit area 100b is similar to that in the first embodiment.

Next, the logic circuit area 100c will be described in detail with reference to FIG. 13B. FIG. 13B is a cross-sectional view taken along a c-c' line in FIG. 12A. As described previously, unlike the first embodiment, the metal layer 50 having a film thickness of 300 to 800 nm is formed at the second principal surface 1b side of the first P type area 30c in the logic circuit area 100c. As shown in FIG. 12B, this metal layer 50 is grounded by being formed to reach the via 56 that is connected to the VSS pad 101c serving as the ground electrode.

By applying this configuration, the back surfaces of the peripheral circuits including the pixel area 100a and the logic circuit area 100c can also be grounded. Accordingly, in addition to the effect of the first embodiment, it is possible to prevent entry of noises attributable to pulses into the logic circuit area 100c and to reduce noises in the pixel area 100a. As a result, the image quality of a reproduced image is further improved.

Figure 14:
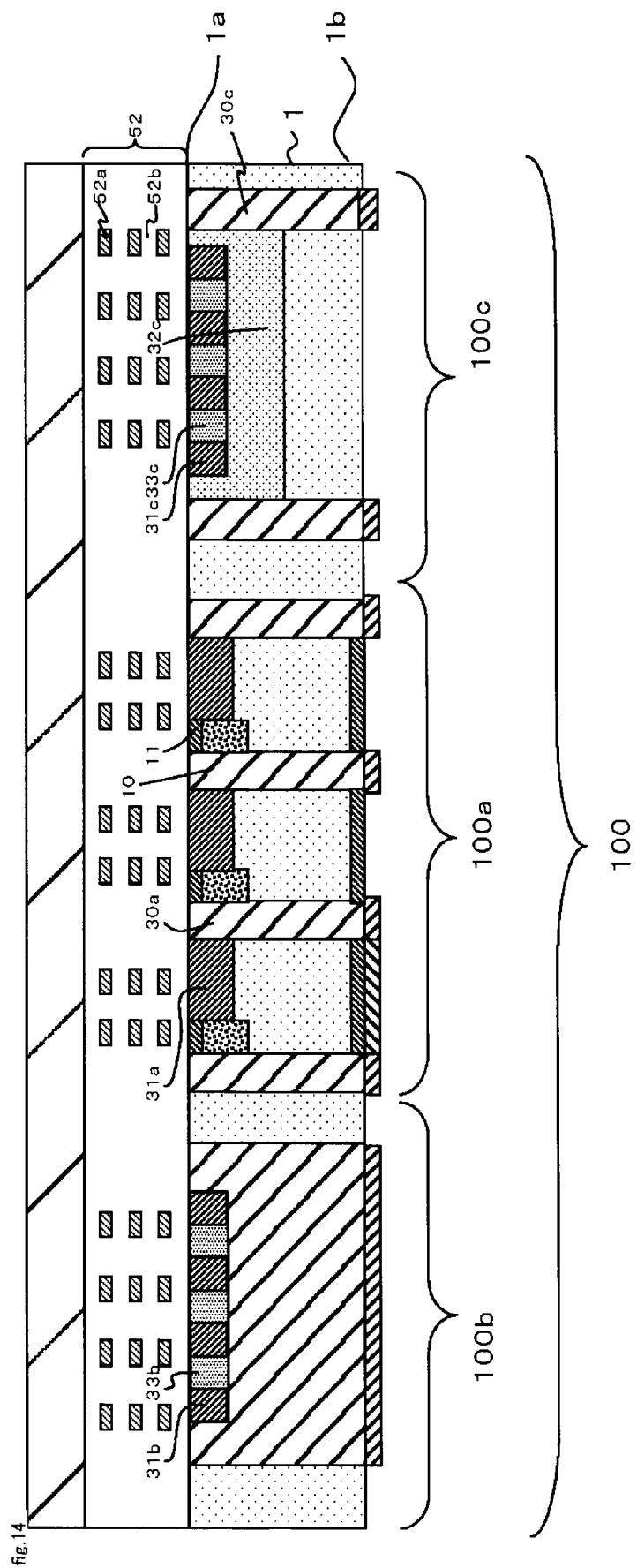
FIG. 14 is a view for explaining a method of manufacturing the backside-illuminated solid-state image pickup device according to the second embodiment.

Next, a manufacturing method of this embodiment will be described with reference to FIG. 14.

First, the manufacturing method from the first step to the step of removing the SOI substrate 200 with the CMP method or the wet etching method using the HF solution and thereby exposing the first P type areas 30a, 30b, and 30c on the second principal surface 1b is the same as that according to the first embodiment as described in FIG. 6A to FIG. 9B.

Next, as shown in FIGS. 12A, 12B, 13A, and 13B, the metal layers 50 such as one made of Al having a film thickness of 300 to 800 nm are formed by sputtering so as to connect the exposed surfaces in the first P type areas 30a, 30b, and 30c exposed on the second principal surface 1b to the VSS pads 101a, 101b, and 101c serving as the ground electrodes through the vias 56, respectively.

In the pixel area 100a, this metal layer 50 is formed in a mesh fashion on the second principal surface 1b so as to connect one end thereof to the VSS pad 101a. Meanwhile, in the logic circuit area 100c, the metal layer 50 is formed along an outer periphery at the second principal surface 1b side of an area where the various elements are formed, in such a manner that one end thereof is connected to the VSS pad 101c as similar to the case of the pixel area 100a. Here, the metal layer 50 in the analog circuit area 100b is configured similarly to the first embodiment.

As described above, by drawing out the metal layers 50 in the respective areas by sputtering, the metal layers 50 to be grounded can be electrically connected to the VSS pads 101a, 101b, and 101c, respectively. As a result, the second principal surface 1b side of the pixel area 100a, the analog circuit area 100b, and the logic circuit area 100c has low resistance of about 3 to 10 O. Hence it is possible to establish ground contact stably and to supply stable pulses to the analog circuit area and to the logic circuit area.

The manufacturing steps thereafter are the same as those in the first embodiment.

According to this embodiment, it is possible to ground the back surfaces of the peripheral circuits including the pixel area and the logic circuit area as well. This prevents entry of noises attributable to pulses into the logic circuit and reduces noises in the pixel area, in addition to the effect of the first embodiment. Hence the image quality of a reproduced image is further improved.

Third Embodiment

Figure 15:
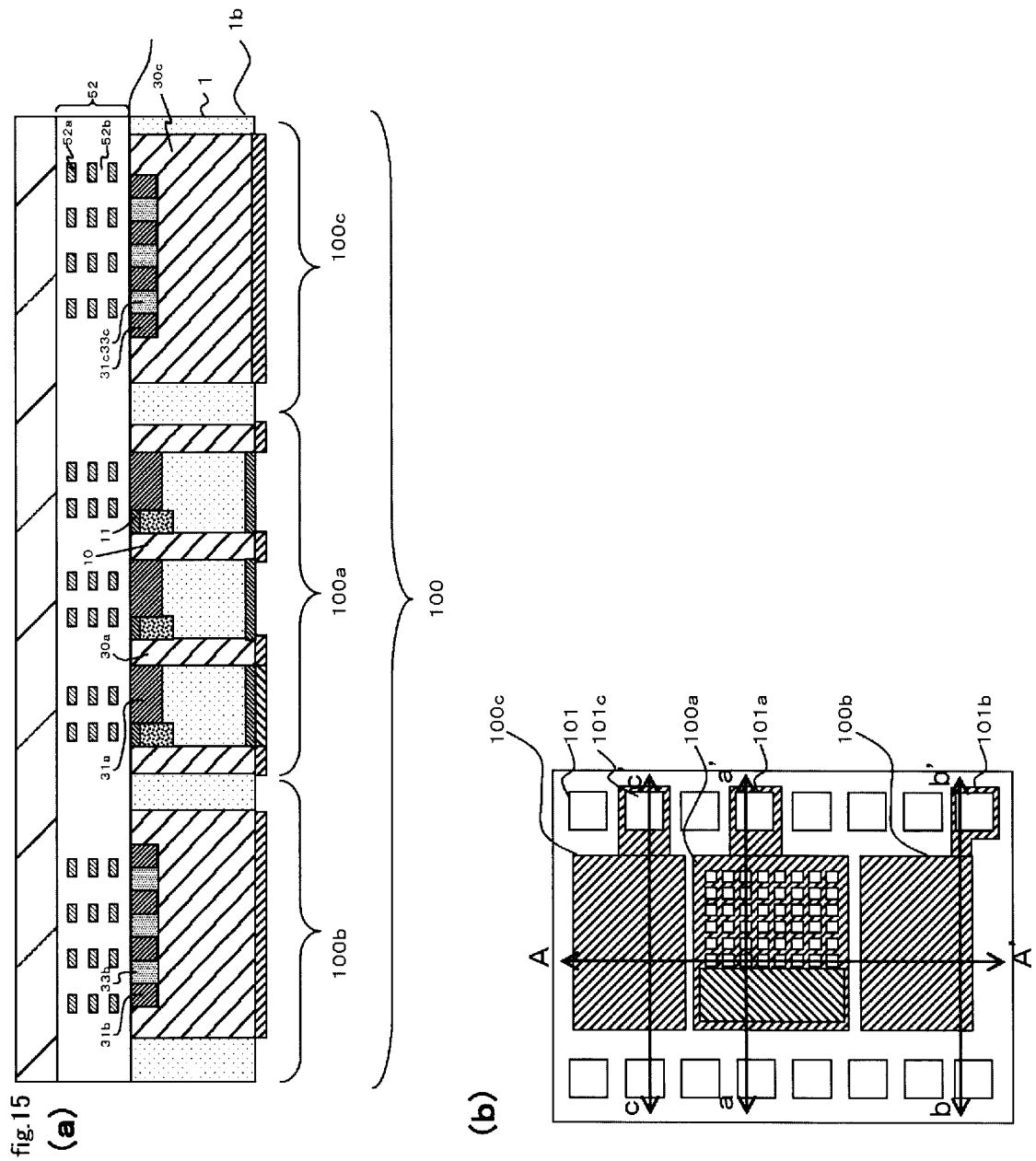
FIG. 15A is a cross-sectional view and FIG. 15B is a plan view of a backside-illuminated solid-state image pickup device according to a third embodiment.

FIG. 15A is a cross-sectional view of a backside-illuminated solid-state image pickup device 100 according to a third embodiment of the present invention, and FIG. 15B is a plan view of the backside-illuminated solid-state image pickup device 100 according to the third embodiment of the present invention.

This embodiment is different from the second embodiment in that a metal layer 50 which is grounded and has a film thickness of 300 to 800 nm is formed on the second principal surface 1b side of the logic circuit area 100c and of the analog circuit area 100b.

Specifically, the logic circuit area 100c includes the first P type area 30c formed to lie between the first principal surface 1a and the second principal surface 1b, the metal layer 50 formed at least partially on the second principal surface 1b of the first P type area 30c, the second N type area formed in part of the first principal surface 1a side of the first P type area 30c, and the VSS pad 101c electrically connected to the metal layer 50. Moreover, an NMOSFET is formed in the first P type area while a PMOSFET is formed in the second N type area as appropriate.

By applying this configuration, it is possible to ground the back surfaces of the pixel area 100a as well as the peripheral circuits including the analog circuit area 100b and the logic circuit area 100c. Hence an effect similar to the effect of the second embodiment can be obtained. In addition, the second principal surface 1b side of the analog circuit area 100b and the logic circuit 100c is covered with the metal layer 50. Accordingly, light incident on the second principal surface 1b is less likely to enter the analog circuit area 100b and the logic circuit area 100c. Thus, it is possible to reduce deterioration in transistor characteristics attributable to excessive electrons generated by photoelectric conversion.

Although formed only in the pixel area 100a in the above-described embodiments, the color filters 13 may also be formed in the analog circuit area 100b and/or in the logic circuit area 100c. Meanwhile, though formed only in the pixel area 100a, the photo-shielding layer 15 may also be formed in the analog circuit area 100b and/or in the logic circuit area 100c. In this way, it is possible to reduce dark currents from the analog circuit area 100b and/or from the logic circuit area 100c and to reduce crosstalk and the like.

Moreover, in the above-described embodiments, the semiconductor layer 1 being the N type epitaxial layer is formed on the SOI substrate. However, the present invention is not limited to this configuration. For example, an N type silicon substrate can be used instead of using the SOI substrate.

Meanwhile, in the above-described embodiments, the metal layer 50 is formed by sputtering for establishing ground contact. Here, the metal layers 50 may be made of silicide.

Moreover, a module applying a backside-illuminated solid-state image pickup device generally establishes ground contact by electrically connecting a diffusion layer (source/drain regions) formed on a first principal surface to ground electrodes outside the module through a via that is formed to penetrate a support substrate.

Figure 16:
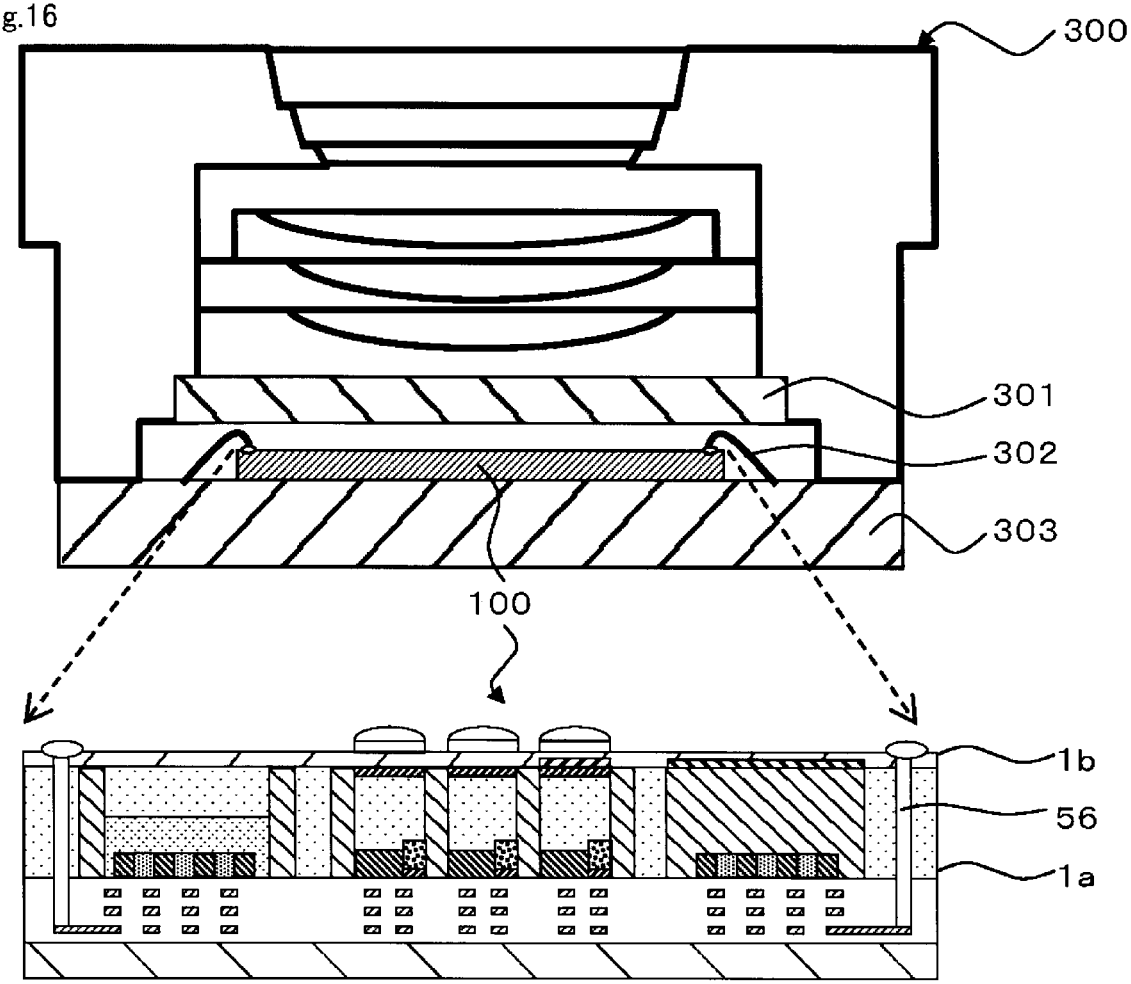
FIG. 16 is a module diagram of a backside-illuminated solid-state image pickup device according to the present invention.

On the other hand, as shown in FIG. 16, a module applying the backside-illuminated solid-state image pickup device of the present invention is configured to dispose the backside-illuminated solid-state image pickup device, which is disposed on a package 303 and electrically connected to the package 303 through bonding wires 302, below cover glass 301 located beneath a lens unit 300.

Then, ground contact is established by electrically connecting the metal layer 50 formed in a wide range on the second principal surface 1b to ground electrodes outside the module through the via 56 formed so as to penetrate the semiconductor layer 1.

For this reason, the backside-illuminated solid-state image pickup device according to the present invention is able to establish ground contact in a wide range on the second principal surface 1b for further stable ground contact. Moreover, this image pickup device does not require a process to cause a via to penetrate a support substrate. Hence the manufacturing steps can be reduced.

What is claimed is:

1. A backside-illuminated solid-state image pickup device comprising:
   a first-conductivity-type semiconductor layer including a first principal surface and a second principal surface opposed to the first principal surface and also including a pixel area and a peripheral circuits area;
   a second-conductivity-type first impurity layer formed to reach the second principal surface from the first principal surface in the peripheral circuits area;
   a first metal layer formed at least partially on the second principal surface of the second-conductivity-type first impurity layer;
   a first ground electrode electrically connected to the first metal layer;
   a photo-conversion area formed in the pixel area; and
   a microlens provided on the second principal surface in the pixel area so as to correspond to the photo-conversion area.

2. The backside-illuminated solid-state image pickup device according to claim 1,
   wherein the peripheral circuits area is an analog circuit area which further includes a first-conductivity-type first impurity layer formed partially in the first principal surface side of the second-conductivity-type first impurity layer, and which has a second-conductivity-type MOSFET and a first-conductivity-type MOSFET formed, as appropriate, in the the first-conductivity-type first impurity layer and the second-conductivity-type first impurity layer, respectively.

3. The backside-illuminated solid-state image pickup device according to claim 1,
   wherein the pixel area further includes:
   a second-conductivity-type second impurity layer formed so as to reach the second principal surface from the first principal surface and to surround the photo-conversion area;
   a second metal layer formed at least partially on the second principal surface of the second-conductivity-type second impurity layer; and
   a second ground electrode electrically connected to the second metal layer.

4. The backside-illuminated solid-state image pickup device according to claim 2,
   wherein the pixel area further includes:
   a second-conductivity-type second impurity layer formed so as to reach the second principal surface from the first principal surface and to surround the photo-conversion area;
   a second metal layer formed at least partially on the second principal surface of the second-conductivity-type second impurity layer; and
   a second ground electrode electrically connected to the second metal layer.

5. The backside-illuminated solid-state image pickup device according to claim 3,
   wherein the peripheral circuits area further includes a logic circuit area,
   the logic circuit area includes:
   a first-conductivity-type second impurity layer formed on the first principal surface side;
   a second-conductivity-type third impurity layer formed so as to surround the first-conductivity-type second impurity layer and to reach the second principal surface from the first principal surface;
   a second-conductivity-type fourth impurity layer formed partially in the first principal surface side of the first-conductivity-type second impurity layer;
   a third metal layer formed at least partially on the second principal surface of the second-conductivity-type third impurity layer; and
   a third ground electrode electrically connected to the third metal layer, and
   a second-conductivity-type MOSFET and a first-conductivity-type MOSFET are formed as appropriate in the first-conductivity-type second impurity layer and the second-conductivity-type fourth impurity layer, respectively.

6. The backside-illuminated solid-state image pickup device according to claim 4,
   wherein the peripheral circuits area further includes a logic circuit area,
   the logic circuit area includes:
   a first-conductivity-type second impurity layer formed on the first principal surface side;
   a second-conductivity-type third impurity layer formed so as to surround the first-conductivity-type second impurity layer and to reach the second principal surface from the first principal surface;
   a second-conductivity-type fourth impurity layer formed partially in the first principal surface side of the first-conductivity-type second impurity layer;

a third metal layer formed at least partially on the second principal surface of the second-conductivity-type third impurity layer; and a third ground electrode electrically connected to the third metal layer, and a second-conductivity-type MOSFET and a first-conductivity-type MOSFET are formed as appropriate in the first-conductivity-type second impurity layer and the second-conductivity-type fourth impurity layer, respectively.

7. The backside-illuminated solid-state image pickup device according to claim 5, wherein the first to third metal layers are electrically connected to the first to third ground electrodes through vias respectively formed to penetrate the first to third metal layers.

8. The backside-illuminated solid-state image pickup device according to claim 6, wherein the first to third metal layers are electrically connected to the first to third ground electrodes through vias respectively formed to penetrate the first to third metal layers.

9. The backside-illuminated solid-state image pickup device according to claim 3, wherein the second ground electrode is formed in a mesh fashion so as to cover the second principal surface side of the second-conductivity-type second impurity layer.

10. The backside-illuminated solid-state image pickup device according to claim 4, wherein the second ground electrode is formed in a mesh fashion so as to cover the second principal surface side of the second-conductivity-type second impurity layer.

11. The backside-illuminated solid-state image pickup device according to claim 5, wherein the second ground electrode is formed in a mesh fashion so as to cover the second principal surface side of the second-conductivity-type second impurity layer.

12. The backside-illuminated solid-state image pickup device according to claim 6, wherein the second ground electrode is formed in a mesh fashion so as to cover the second principal surface side of the second-conductivity-type second impurity layer.

13. The backside-illuminated solid-state image pickup device according to claim 7, wherein the second ground electrode is formed in a mesh fashion so as to cover the second principal surface side of the second-conductivity-type second impurity layer.

14. The backside-illuminated solid-state image pickup device according to claim 8, wherein the second ground electrode is formed in a mesh fashion so as to cover the second principal surface side of the second-conductivity-type second impurity layer.

15. The backside-illuminated solid-state image pickup device according to claim 1, wherein the peripheral circuits area further includes a logic circuit area, the logic circuit area includes:

a second-conductivity-type third impurity layer formed to reach the second principal surface from the first principal surface;

a third metal layer formed at least partially on the second principal surface of the second-conductivity-type third impurity layer;

a first-conductivity-type second impurity layer formed partially in the first principal surface side of the second-conductivity-type third impurity layer; and a third ground electrode electrically connected to the third metal layer, and a second-conductivity-type MOSFET and a first-conductivity-type MOSFET are formed as appropriate in the first-conductivity-type second impurity layer and the second-conductivity-type third impurity layer, respectively.

16. The backside-illuminated solid-state image pickup device according to claim 2, wherein the peripheral circuits area further includes a logic circuit area, the logic circuit area includes:

a second-conductivity-type third impurity layer formed to reach the second principal surface from the first principal surface;

a third metal layer formed at least partially on the second principal surface of the second-conductivity-type third impurity layer;

a first-conductivity-type second impurity layer formed partially in the first principal surface side of the second-conductivity-type third impurity layer; and a third ground electrode electrically connected to the third metal layer, and a second-conductivity-type MOSFET and a first-conductivity-type MOSFET are formed as appropriate in the first-conductivity-type second impurity layer and the second-conductivity-type third impurity layer, respectively.

17. The backside-illuminated solid-state image pickup device according to claim 4, wherein the peripheral circuits area further includes a logic circuit area, the logic circuit area includes:

a second-conductivity-type third impurity layer formed to reach the second principal surface from the first principal surface;

a third metal layer formed at least partially on the second principal surface of the second-conductivity-type third impurity layer;

a first-conductivity-type second impurity layer formed partially in the first principal surface side of the second-conductivity-type third impurity layer; and a third ground electrode electrically connected to the third metal layer, and a second-conductivity-type MOSFET and a first-conductivity-type MOSFET are formed as appropriate in the first-conductivity-type second impurity layer and the second-conductivity-type third impurity layer, respectively.

* * * * *